US012811097B2

(12) United States Patent
Kim et al.

(10) Patent No.: US 12,811,097 B2
(45) Date of Patent: Nov. 24, 2026

(54) APPARATUS FOR PROCESSING PLASMA AND METHOD OF PROCESSING PLASMA AND MANUFACTURING SEMICONDUCTOR DEVICE USING THE SAME

(71) Applicant: Samsung Electronics Co., Ltd., Suwon-si (KR)

(72) Inventors: Hyunbae Kim, Suwon-si (KR); Jihwan Kim, Suwon-si (KR); Sangki Nam, Suwon-si (KR); Daeun Son, Suwon-si (KR); Seungbo Shim, Suwon-si (KR); Juho Lee, Suwon-si (KR); Hyunjae Lee, Suwon-si (KR); Hyunhak Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 634 days.

(21) Appl. No.: 18/232,992

(22) Filed: Aug. 11, 2023

(65) Prior Publication Data

US 2024/0128055 A1 Apr. 18, 2024

(30) Foreign Application Priority Data

Oct. 18, 2022 (KR) ........................ 10-2022-0134464
Dec. 29, 2022 (KR) ........................ 10-2022-0189380

(51) Int. Cl.
*H01J 37/32* (2006.01)

(52) U.S. Cl.
CPC .. *H01J 37/32174* (2013.01); *H01J 37/32128* (2013.01); *H01J 2237/0473* (2013.01)

(58) Field of Classification Search
CPC ........... H01J 37/32174; H01J 37/32128; H01J 2237/0473; H01J 37/32146; H01J 37/32706
USPC ............................................ 216/67; 438/714
See application file for complete search history.

(56) References Cited

U.S. PATENT DOCUMENTS

| | | | |
|---|---|---|---|
| 8,923,349 B2 | 12/2014 | Huber et al. | |
| 9,082,594 B2 | 7/2015 | Valcore, Jr. et al. | |
| 11,170,979 B2 | 11/2021 | Nagami et al. | |
| 2002/0115301 A1 | 8/2002 | Savas | |
| 2014/0262755 A1 | 9/2014 | Deshmukh et al. | |
| 2021/0202276 A1* | 7/2021 | Song ................. | H01J 37/32568 |

(Continued)

FOREIGN PATENT DOCUMENTS

| | | | | |
|---|---|---|---|---|
| JP | 2022-095681 A | | 6/2022 | |
| KR | 10-2021-0139156 A | | 11/2021 | |
| TW | 202221756 A | * | 6/2022 | .............. H10P 72/72 |

*Primary Examiner* — Duy Vu N Deo
(74) *Attorney, Agent, or Firm* — Muir Patent Law, PLLC

(57) ABSTRACT

A method of manufacturing a semiconductor device includes placing a wafer in a plasma chamber, the chamber including a first power generator configured to generate plasma ions in the chamber, and a second power generator configured to accelerate the plasma ions toward the wafer, generating a radio frequency (RF) signal having a repeated periodic sinusoidal waveform in an on state and a steady off state by the first power generator, and generating a direct current (DC) bias signal having a repeated periodic non-sinusoidal waveform in an on state and a steady off state by the second power generator. The RF signal and the DC bias signal are offset from each other. The method further includes performing a plasma process on a layer on the wafer, using the RF signal and DC bias signal.

18 Claims, 33 Drawing Sheets

(56) References Cited

U.S. PATENT DOCUMENTS

| | | | | |
|---|---|---|---|---|
| 2022/0037121 | A1* | 2/2022 | Dorf | H01J 37/32128 |
| 2022/0336222 | A1* | 10/2022 | Zhou | H10P 50/283 |
| 2023/0087307 | A1* | 3/2023 | Guo | H01J 37/32146 315/111.21 |

* cited by examiner

APPARATUS FOR PROCESSING PLASMA AND METHOD OF PROCESSING PLASMA AND MANUFACTURING SEMICONDUCTOR DEVICE USING THE SAME

CROSS-REFERENCE TO RELATED APPLICATION

This application is based on and claims priority under 35 U.S.C. § 119 to Korean Patent Application No. 10-2022-0134464, filed on Oct. 18, 2022, in the Korean Intellectual Property Office, and Korean Patent Application No. 10-2022-0189380, filed on Dec. 29, 2022, in the Korean Intellectual Property Office, the disclosures of which are incorporated by reference herein in their entirety.

BACKGROUND

The inventive concept relates to a plasma processing apparatus and method for manufacturing a semiconductor device.

Semiconductor devices are formed by using various semiconductor manufacturing processes, such as deposition processes, ion injection processes, photolithography processes, and etching processes. As semiconductor devices are highly integrated, the linewidths of patterns included in the semiconductor devices have decreased and the aspect ratios of patterns have increased. Due to the decrease in linewidth and/or increase in aspect ratio, the difficulty of semiconductor manufacturing processes is getting higher and higher. Accordingly, various methods of forming a fine structure of a high aspect ratio with high reliability are being researched.

SUMMARY

Aspects of the inventive concept provide an apparatus for processing plasma and a method of processing plasma using the same, which may improve selectivity of an etching mask and also improve etching distribution.

According to an aspect of the inventive concept, a method of manufacturing a semiconductor device includes placing a wafer in a plasma chamber, the chamber including a first power generator configured to generate plasma ions in the chamber, and a second power generator configured to accelerate the plasma ions toward the wafer, generating a radio frequency (RF) signal having a repeated periodic sinusoidal waveform in an on state and a steady off state by the first power generator, and generating a direct current (DC) bias signal having a repeated periodic non-sinusoidal waveform in an on state and a steady off state by the second power generator. The RF signal and the DC bias signal are offset from each other. The method further includes performing a plasma process on a layer on the wafer, using the RF signal and DC bias signal.

According to an aspect of the inventive concept, a method of manufacturing a semiconductor device using a chamber in which a plasma process is performed includes placing a wafer on a bottom electrode located inside the chamber; generating a first reference voltage in a first time section and first power in a second time section and applying the first reference voltage and first power to the bottom electrode; and generating a second reference voltage in a third time section and second power in a fourth time section and applying the second reference voltage and the second power to the bottom electrode. The first and second time sections arrive alternately and repeatedly, and form a first steady signal alternating with an RF signal, the third and fourth time sections arrive alternately and repeatedly, overlap the first and second time sections, and form a second steady signal alternating with a periodic signal, the second power is generated as a signal having a non-sinusoidal waveform, and the second reference voltage in the third time section and second power in the fourth time section form a direct current (DC) bias signal, the first reference voltage in the first time section and first power in the second time section form a radio frequency (RF) signal, and the RF signal and the DC bias signal are offset from each other.

According to an aspect of the inventive concept, a method manufacturing a semiconductor device includes placing a wafer in a chamber; generating first power to generate plasma in the chamber; generating second power to control ion energy of the plasma; and applying the first and second powers to the chamber to perform a plasma process on the wafer. The first power comprises a radio frequency (RF) signal, the second power includes a direct current (DC) bias signal, the second power has a non-sinusoidal waveform, and the RF signal and the DC bias signal are applied at the same time in the chamber and are offset from each other.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
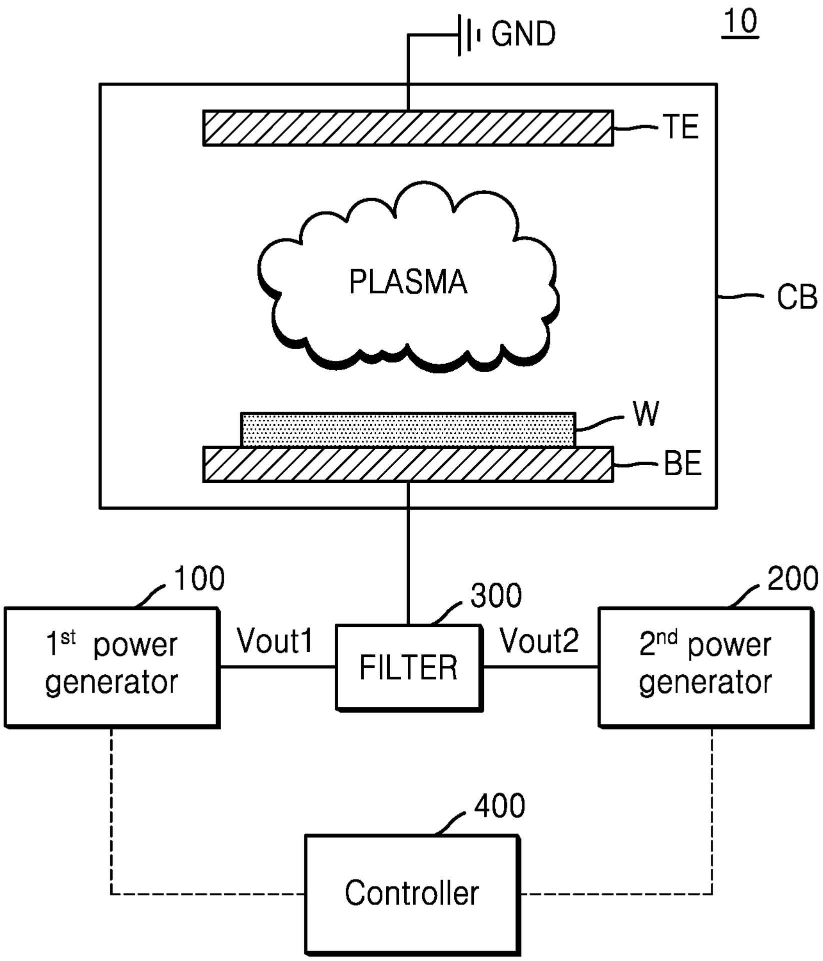
FIG. 1A is a schematic view for explaining an apparatus for processing plasma according to an embodiment.
Figure 1B:
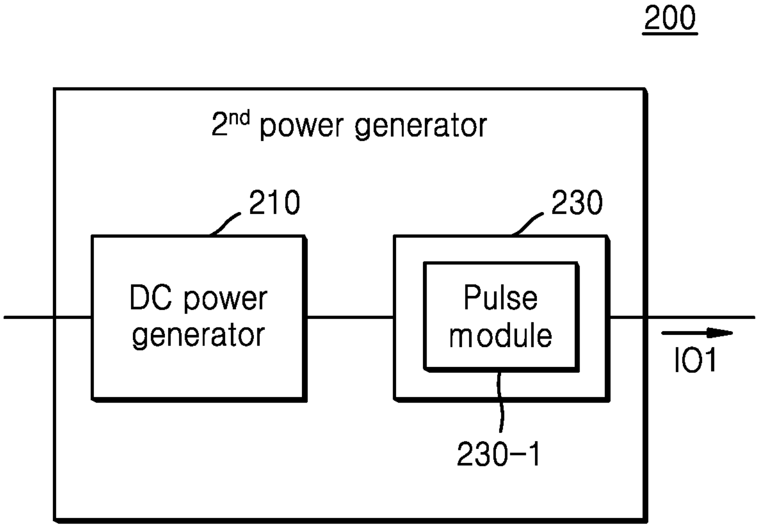
FIG. 1B is a block diagram of the configuration of a second power generator according to an embodiment.
Figure 1C:
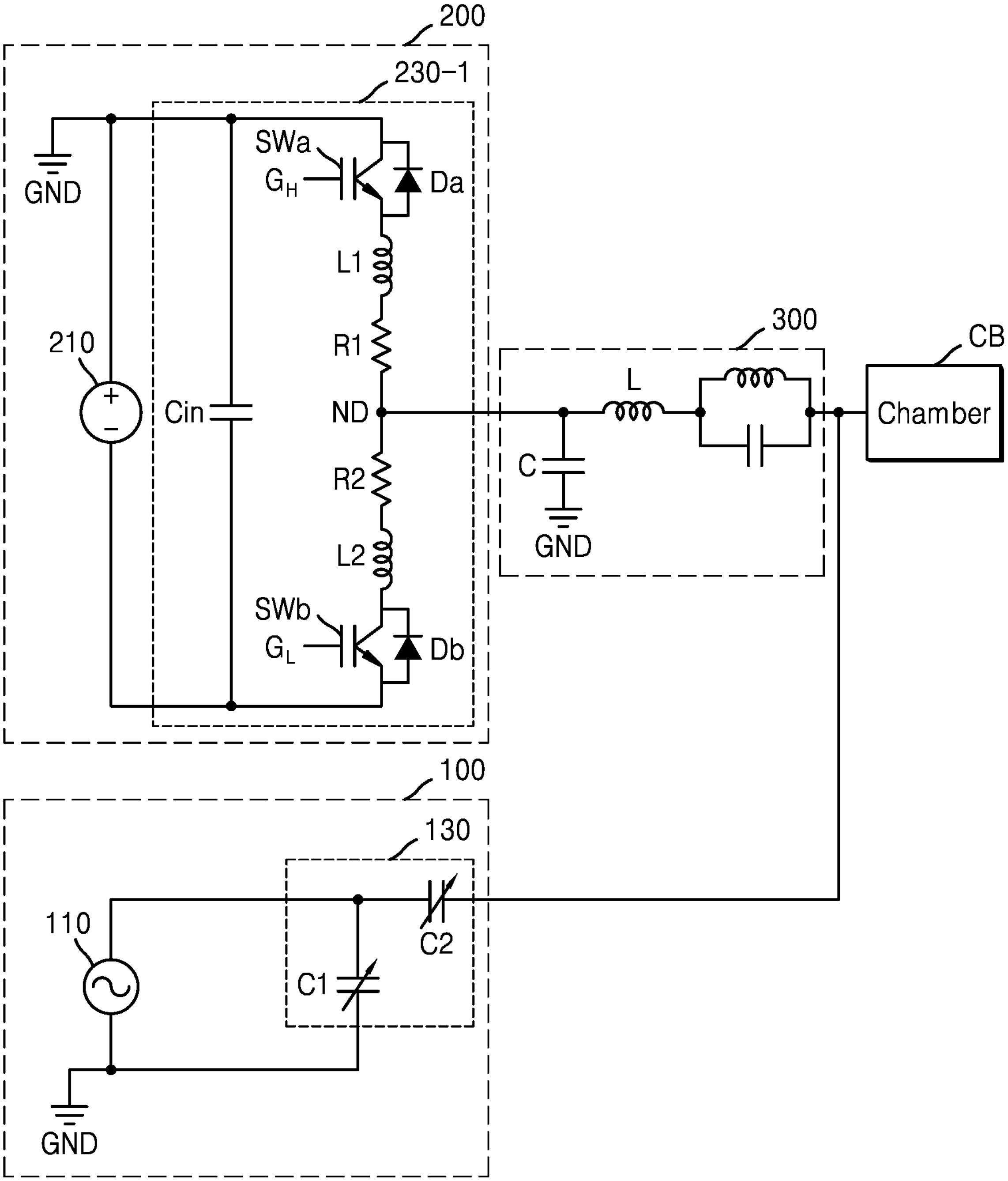
FIG. 1C is a circuit diagram of a first power generator, a second power generator, and a filter, according to an embodiment.

Hereinafter, embodiments of the inventive concept will be described more fully with reference to the accompanying drawings. Throughout the drawings, like reference numerals denote like elements, and redundant descriptions thereof are omitted FIG. 1A is a schematic view for explaining an apparatus 10 for processing plasma, according to an embodiment. FIG. 1B is a block diagram of the configuration of a second power generator 200 according to an embodiment. FIG. 1C is a circuit diagram of a first power generator 100, the second power generator 200, and a filter 300 according to an embodiment.

Referring to FIGS. 1A to 1C, the apparatus 10 for processing plasma may include the first power generator 100, the second power generator 200, the filter 300, and a controller 400. The apparatus 10 for processing plasma may perform any one of ion beam etching, plasma-based material film deposition, and ion cleaning. In the following description, for convenience of explanation, an example in which the wafer W that is a process target is disposed in a chamber CB, and the apparatus 10 for processing plasma in a wafer processing apparatus for processing the wafer W is mainly described. The wafer may be a substrate, such as a semiconductor substrate, for example.

A top electrode TE may be disposed in an upper area of the chamber CB, a bottom electrode BE may be disposed in a lower area of the chamber CB, and the wafer W may be disposed on the bottom electrode BE. According to some embodiments, the bottom electrode BE may include an electrostatic chuck (ESC) that fixes and supports the wafer W by using an electrostatic force. Furthermore, the chamber CB may include a gas supply portion (not shown) and a gas discharge portion (not shown), and the gas supply portion may supply a reactive gas into the chamber CB and discharge the gas through the gas discharge portion, thereby maintaining the chamber CB in a vacuum state.

The apparatus 10 for processing plasma illustrated in FIG. 1A is an example of a capacitively coupled plasma chamber, for convenience of explanation, in which a ground potential is applied to the top electrode TE and radio frequency (RF) power and bias power is applied to the bottom electrode BE, but the inventive concept is not limited thereto. For example, the apparatus 10 for processing plasma may be a continuous wave radical controlled plasma chamber in which RF power is applied to the top electrode TE and a bias voltage is applied to the bottom electrode BE.

The first power generator 100 may include an RF power generator 110 and a matcher 130. The first power generator 100 may generate a first output voltage Vout1, and may provide the generated first output voltage Vout1 to the bottom electrode BE. The first power generator 100 may generate plasma ions in the chamber CB. The first output voltage Vout1, as power for generating plasma, may be referred to as source power or RF power. According to some embodiments, the first output voltage Vout1 generated by the RF power generator 110 may be a sinusoidal voltage of an RF. The matcher 130 may be connected between the RF power generator 110 and the chamber CB. The matcher 130 may allow the RF voltage generated by the first power generator 100 to be transmitted to the chamber CB to the maximum, by adjusting impedance. Therefore, the matcher 130 may improve a transmission efficiency of the RF voltage.

Although FIG. 1C illustrates, as an example, that the matcher 130 is an L-type matcher including a first capacitor C1 and a second capacitor C2, the matcher 130 may be alternatively be a Pi-type matcher.

The second power generator 200 may include a direct current (DC) power generator 210 and a modulator 230. The second power generator 200 may generate a second output voltage Vout2, and provide the generated second output voltage Vout2 to the bottom electrode BE. The second output voltage Vout2, as power to control ion energy of plasma, may be a bias voltage. For example, the second output voltage Vout2 may accelerate plasma ions. When second power is provided to the bottom electrode BE, a voltage may be induced to the wafer W placed on the bottom electrode BE. Accordingly, the voltage of the wafer W may be controlled according to the second power, and thus, the ion energy of plasma generated in the chamber CB may be controlled.

In the present embodiment, the second power generator 200 may output a high-voltage and high-frequency voltage waveform set by a user. For example, the second power generator 200 may output a voltage output at a frequency of several kilohertz (kHz) to several megahertz (MHz) and having a certain waveform of several tens of volts (V) to several tens of kilovolts (kV). For example, the second power generator 200 may generate a DC voltage having a frequency of about 1 kHz to about 1 MHz.

The DC power generator 210 may generate a DC voltage and provide the DC voltage to the modulator 230. The DC power generator 210 may be referred to as a DC power 210. The modulator 230 may include a plurality of power element switches. The modulator 230 may generate a bias voltage having a non-sinusoidal waveform by controlling the DC voltage supplied from the DC power generator 210 through the power element switches, and apply the bias voltage to the bottom electrode BE. For example, the modulator 230 may generate a bias voltage having a square wave voltage waveform, and apply the bias voltage to the bottom electrode BE.

The modulator 230 may include a pulse module 230-1. The pulse module 230-1 may include a plurality of pulse control switches. The pulse module 230-1 may generate a bias voltage having a non-sinusoidal voltage waveform by selectively turning off the pulse control switches.

The pulse module 230-1 may generate and output a first output current IO1. The first output current IO1 may be a pulse current having a variable magnitude, and the pulse module 230-1 may be a variable constant current source. The pulse module 230-1 may be a circuit configured to apply the second output voltage Vout2 of a square wave to the chamber CB. The square wave according to the present embodiment is such that the second output voltage Vout2 that is on duty (e.g., a first part of a duty cycle) may be less than the second output voltage Vout2 that is off duty (e.g., a second part of a duty cycle), but the disclosure is not limited thereto.

Figure 13:
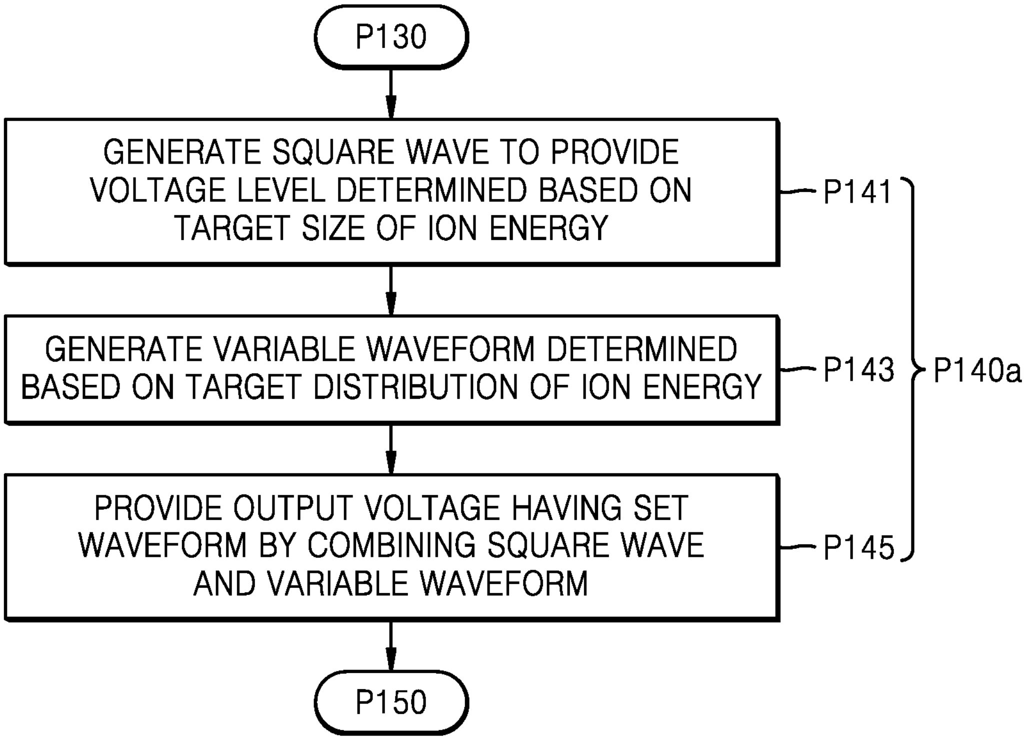
FIG. 13 is a flowchart of a method of applying a non-sinusoidal DC bias voltage to a plasma chamber, according to an embodiment.

For example, the pulse module 230-1 may output the first output current IO1 having a first magnitude during a section (e.g., time period) in which plasma is generated from a plasma gas (for example, P130 of FIG. 10), and output the first output current IO1 having a second magnitude different from the first magnitude during a section (e.g., time period) in which the semiconductor process is performed (for example, P150 of FIG. 13). The pulse module 230-1 may output the first output current IO1 having a positive value and subsequently the first output current IO1 having a negative value.

For example, after applying the first output current IO1 having a negative value to the chamber CB during a set first time section, the pulse module 230-1 may apply the first output current IO1 having the same magnitude and the opposite direction, that is, the first output current IO1 having a positive value, to the chamber CB, during a set subsequent second time section.

The pulse module 230-1 may include first and second switches SWa and SWb. The first switch SWa may be connected between a positive terminal of the DC power generator 210 and a node ND, and may be driven by a first gate driving signal $G_H$. The second switch SWb may be connected between the node ND and a negative terminal of the DC power generator 210, and may be driven by a second gate driving signal $G_L$. A positive terminal of the DC power generator 210 may be connected to a ground terminal GND. The node ND may be an output node of the modulator 230. When the modulator 230 is activated, the first switch SWa is turned off and the second switch SWb is turned on, a negative voltage corresponding to the DC power generator 210 may be provided to the node ND In an embodiment, the pulse module 230-1 may further include a gate driver. The gate driver may turn on/off the first and second switches SWa and SWb at a speed of several nanoseconds (nsec) to several hundreds of nanoseconds. Accordingly, the first and second switches SWa and SWb may generate square waves. In detail, the gate driver may provide the first and second gate driving signals $G_H$ and $G_L$. The second gate driving signal $G_L$ may be an inverted signal of the first gate driving signal $G_H$. In an embodiment, the pulse module 230-1 may receive the first and second gate driving signals $G_H$ and $G_L$ externally, for example, from the controller 400.

The pulse module 230-1 may further include diodes Da and Db. The diodes Da and Db may be free wheeling diodes for preventing damage to switches SWa and SWb.

The pulse module 230-1 may further include an input capacitor Cin. The input capacitor Cin may serve as a filter to maintain a DC voltage generated by the DC power generator 210.

The pulse module 230-1 may include first and second resistors R1 and R2 and first and second inductors L1 and L2. The first resistor R1 and the first inductor L1 may be arranged between the first switch SWa and the node ND, and the second resistor R2 and the second inductor L2 may be arranged between the second switch SWb and the node ND. For example, the first resistor R1 and/or the second resistor R2 may have a resistance level within about several tens of ohms (a).

As the pulse module 230-1 includes the first and second resistors R1 and R2 and the first and second inductors L1 and L2, the second output voltage Vout2 applied to the chamber CB may not vibrate. Accordingly, the reliability of the second power generator 200 may be improved. Although not illustrated in FIG. 1C, a capacitor may be further arranged between the first switch SWa and the node ND. Furthermore, a capacitor may be further arranged between the second switch SWb and the node ND.

Although FIG. 1C illustrates that the first and second switches SWa and SWb are power metal oxide semiconductor field effect transistors (MOSFETs), the disclosure is not limited thereto. For example, the first and second switches SWa and SWb may be insulated gate bipolar transistors (IGBTs).

The filter 300 may block the first output voltage Vout1 to prevent the first output voltage Vout1 generated by the first power generator 100 from being applied to the second power generator 200, and allow second power to pass therethrough to allow the second output voltage Vout2 generated by the second power generator 200 to be applied to the bottom electrode BE. In detail, the filter 300 may remove a frequency component of the RF power generated by the first power generator 100. Although FIG. 1C illustrates, as an example, that the filter 300 includes one low pass filter and one band stop filter, the disclosure is not limited thereto. For example, the filter 300 may include a plurality of low pass filters, a plurality of band stop filters, or a combination thereof. For example, the filter 300 may include one or more inductors L and/or one or more capacitors C.

The controller 400 may control the overall operation of the apparatus 10 for processing plasma. The controller 400 may control an output current of each of the first power generator 100 and/or the second power generator 200. The controller 400 may include a computing device, such as a workstation computer, a desktop computer, a laptop computer, a tablet computer, and the like. The controller 400 may consist of separate hardware or separate software included in one piece of hardware. The controller 400 may include a simple controller, a microprocessor, a complicated processor such as a central processing unit (CPU), a graphics processing unit (GPU), and the like, a processor configured by software, or dedicated hardware or firmware. The controller 400 may be implemented by, for example, a general purpose computer or application-specific hardware, such as digital signal processing (DSP), a field programmable gate array (FPGA), an application specific integrated circuit (ASIC), and the like.

According to some embodiments, the operation of the controller 400 may be implemented by instructions stored in a machine readable medium and read and executed by one or more processors. The machine readable medium may include a mechanism for storing and/or transmitting information in the form of being read by machine, for example, a computing device. For example, the machine readable medium may include read only memory (ROM), random access memory (RAM), a magnetic disk storage medium, an optical storage medium, flash memory devices, electrical, optical, acoustic, or other types of radio signals (for example, carrier waves, infrared signals, digital signals, etc.), and other arbitrary signals.

To perform the operation described with respect to the controller 400, or a certain process described below, the controller 400 may include firmware, software, routines, or instructions. For example, the controller 400 may be implemented by software for performing functions such as determining the size, direction (i.e., polarity), and/or cycle of an output current of each of the first power generator 100 and/or the second power generator 200. However, this is for convenience of explanation, and the operation of the controller 400 described above may be caused by a computing device, a processor, a controller, or other devices executing firmware, software, routines, instructions, and the like.

The reactive gas may be diffused within the chamber CB, and may be converted into plasma by the first output voltage Vout1 applied through the bottom electrode BE. The plasma may physically and chemically react when contacting the wafer W surface, and through the physical and chemical reaction, a wafer processing process, such as plasma annealing, etching, plasma enhanced chemical vapor deposition, physical vapor deposition, plasma cleaning, and the like, may be performed.

For example, when the apparatus 10 for processing plasma is used for an etching process, a film to be processed on the wafer W may be etched in a desired pattern by radicals, electrons, and ions activated by plasma. According to the present embodiment, as radicals, electrons, or ions of plasma precisely control energy distribution, or etching performance, such as an etching rate, an aspect ratio, a critical dimension of an etching pattern, a profile of an etching pattern, selectivity, and the like, may be improved.

Figure 2A:
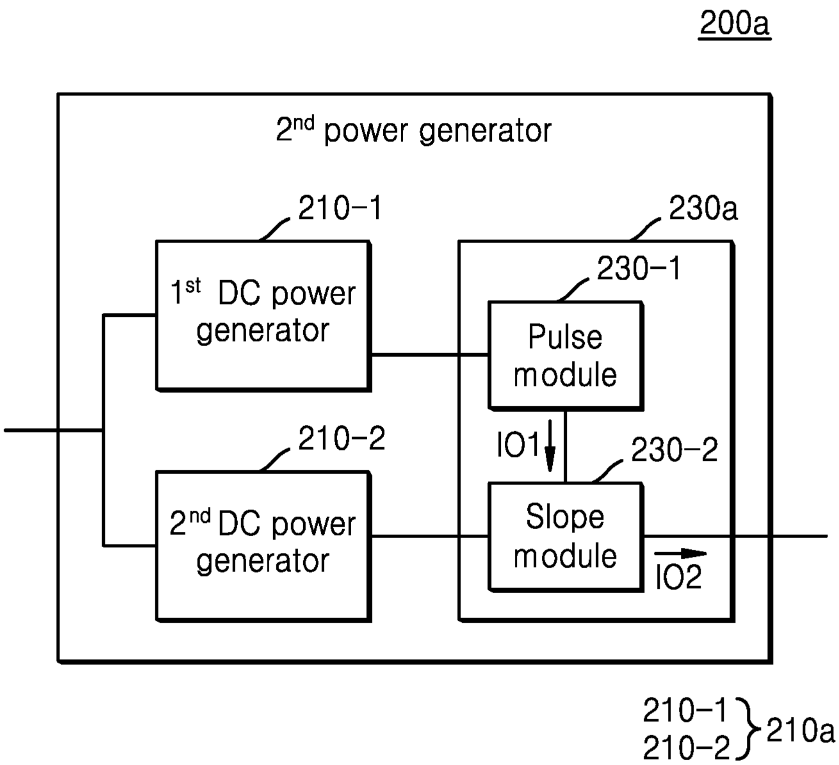
FIG. 2A is a block diagram of the configuration of a second power generator according to another embodiment.
Figure 2B:
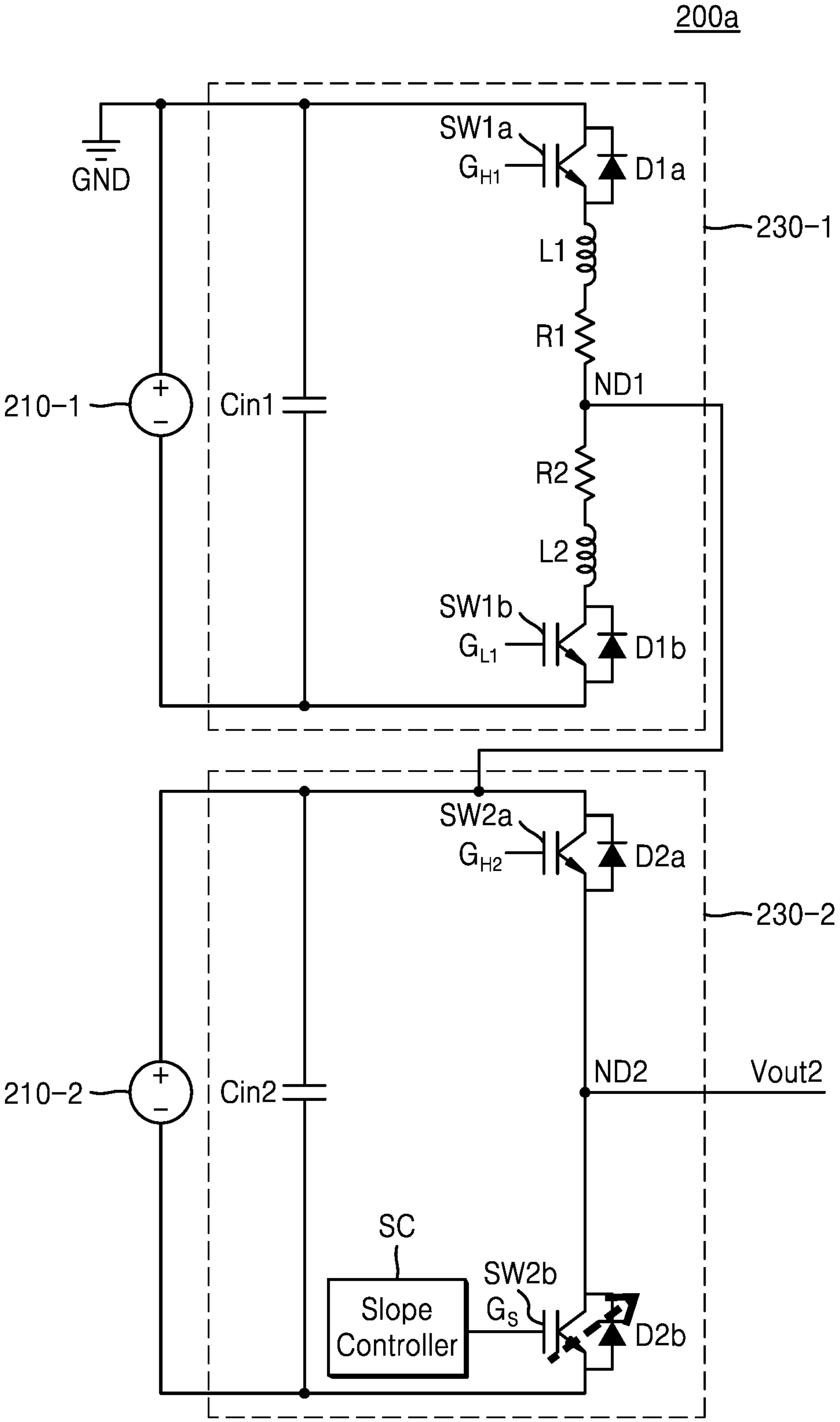
FIG. 2B is a circuit diagram of the second power generator of FIG. 2A, according to an embodiment.

FIG. 2A is a block diagram of the configuration of a second power generator 200*a* according to another embodiment. FIG. 2B is a circuit diagram of the second power generator 200*a* of FIG. 2A. For convenience of explanation, differences from FIGS. 1A to 1C are mainly described while redundant descriptions therebetween are omitted.

Referring to FIGS. 2A and 2B, the second power generator 200*a* may include a DC power generator 210*a* and a modulator 230*a*. The DC power generator 210*a* may include a first DC power source 210-1 for applying DC power to the pulse module 230-1 and a second DC power source 210-2 for applying DC power to a slope module 230-2. The modulator 230*a*, unlike the modulator 230 of FIG. 1B, may include the pulse module 230-1 and the slope module 230-2. The pulse module 230-1 may include a similar configuration to the pulse module 230-1 of FIG. 1B, and may operate in a similar method.

A positive terminal of the first DC power source 210-1 may be connected to the ground terminal GND. For example, the pulse module 230-1 may generate a unidirectional voltage. For example, the pulse module 230-1 may generate a unidirectional negative voltage. This means that the pulse module 230-1 generates only a voltage less than or equal to a reference voltage (Vref of FIG. 5A). The pulse module 230-1 may include the first and second switches SW1*a* and SW1*b*. The first switch SW1*a* of the pulse module 230-1 is connected between the positive terminal of the first DC power source 210-1 and a first node ND1, and may be driven by a first gate driving signal $G_{H1}$. The second switch SW1*b* of the pulse module 230-1 is connected between the first node ND1 and the negative terminal of the first DC power source 210-1, and may be driven by a second gate driving signal $G_{L1}$.

The slope module 230-2 may include the second DC power source 210-2 and the first and second switches SW2*a* and SW2*b*. The first switch SW2*a* of the slope module 230-2 may be connected between the first node ND1 and a second node ND2, and may be driven by a first gate driving signal $G_{H2}$. The second switch SW2*b* of the slope module 230-2 may be connected between the second node ND2 and a negative terminal of the second DC power source 210-2. The second node ND2 may be an output node of the slope module 230-2 and an output node of the second power generator 200*a*. When the slope module 230-2 is activated, that is, the first switch SW2*a* of the slope module 230-2 is turned off, and when the second switch SW2*b* of the slope module 230-2 is turned on, a sum of the voltage of the first node ND1 and a negative voltage corresponding to the second DC power source 210-2 may be provided to the second node ND2 as a variable voltage controlled by a slope controller SC.

Furthermore, the slope module 230-2 may further include the slope controller SC to provide a driving signal GS to control a transition section of the second switch SW2*b* of the slope module 230-2, to the second switch SW2*b* of the slope module 230-2. The slope controller SC may drive the second switch SW2*b* of the slope module 230-2 by a current control method, and the driving signal GS may be implemented as a current. The slope of the second output voltage Vout2 provided from the second node ND2 may be proportional to the driving signal GS.

The pulse module 230-1 and the slope module 230-2 may be connected to each other by a cascade method. In detail, the first node ND1 of the pulse module 230-1 is connected to the first switch SW2*a* of the slope module 230-2, and the second node ND2 of the slope module 230-2 may provide the second output voltage Vout2.

In one embodiment, each of the first and second DC power sources 210-1 and 210-2 may provide a voltage of the same level. However, the disclosure is not limited thereto, and in another embodiment, the first and second DC power sources 210-1 and 210-2 may provide voltages of different levels.

The pulse module 230-1 may include the first and second resistors R1 and R2 and the first and second inductors L1 and L2. The first resistor R1 and the first inductor L1 may be arranged between the first switch SW1*a* of the pulse module 230-1 and the first node ND, and the second resistor R2 and the second inductor L2 may be arranged between the second switch SW1*b* of the pulse module 230-1 and the first node ND1.

The pulse module 230-1 and the slope module 230-2 may each further include diodes D1*a* and D1*b*, and D2*a* and D2*b*. The diodes D1*a* to D2*b* are free wheeling diodes for preventing damage to the first and second switches SW1*a* to SW2*b*.

Furthermore, the pulse module 230-1 and the slope module 230-2 may further include first and second input capacitors Cin1 and Cin2, respectively. The first and second input capacitors Cin1 and Cin2 may serve as filters for maintaining DC voltages of the first and second DC power sources 210-1 and 210-2.

The slope module 230-2 may generate a second output current IO2 having a variable magnitude. The slope module 230-2 may be a circuit for forming a slope on the on-duty of a square wave of the second output voltage Vout2. Accordingly, the second output voltage Vout2 having a slope on the on-duty of a square wave may be applied to the chamber CB. The second output current IO2 may be a pulse current having a variable magnitude, and the slope module 230-2 may be a variable (e.g., adjustable) constant current source. The second output voltage Vout2 applied to the chamber CB may vary depending on the magnitudes and application durations of the first and second output currents IO1 and IO2 applied to the chamber CB.

According to embodiments, for the second output voltage Vout2 of a set waveform to be applied to the chamber CB, the second power generator 200*a* may apply the first and second output currents IO1 and IO2 that are pulse type currents to the chamber CB in various orders. For example, the second power generator 200*a* may i) relatively rapidly drop the voltage of the chamber CB from an initial voltage by applying the first output current IO1 of a pulse type to the chamber CB, ii) relatively slowly drop the voltage of the chamber CB by applying the second output current IO2 of a pulse type to the chamber CB, and iii) rapidly raise the voltage of the chamber CB to the initial voltage level by applying the first output current IO1 of a pulse type in a direction opposite to the direction in i) to the chamber CB.

In FIG. 2B, the first and second switches SW1*a* to SW2*b* are illustrated as power MOSFETs, but the disclosure is not limited thereto. For example, the first and second switches SW1*a* to SW2*b* may be IGBTs.

Figure 3:
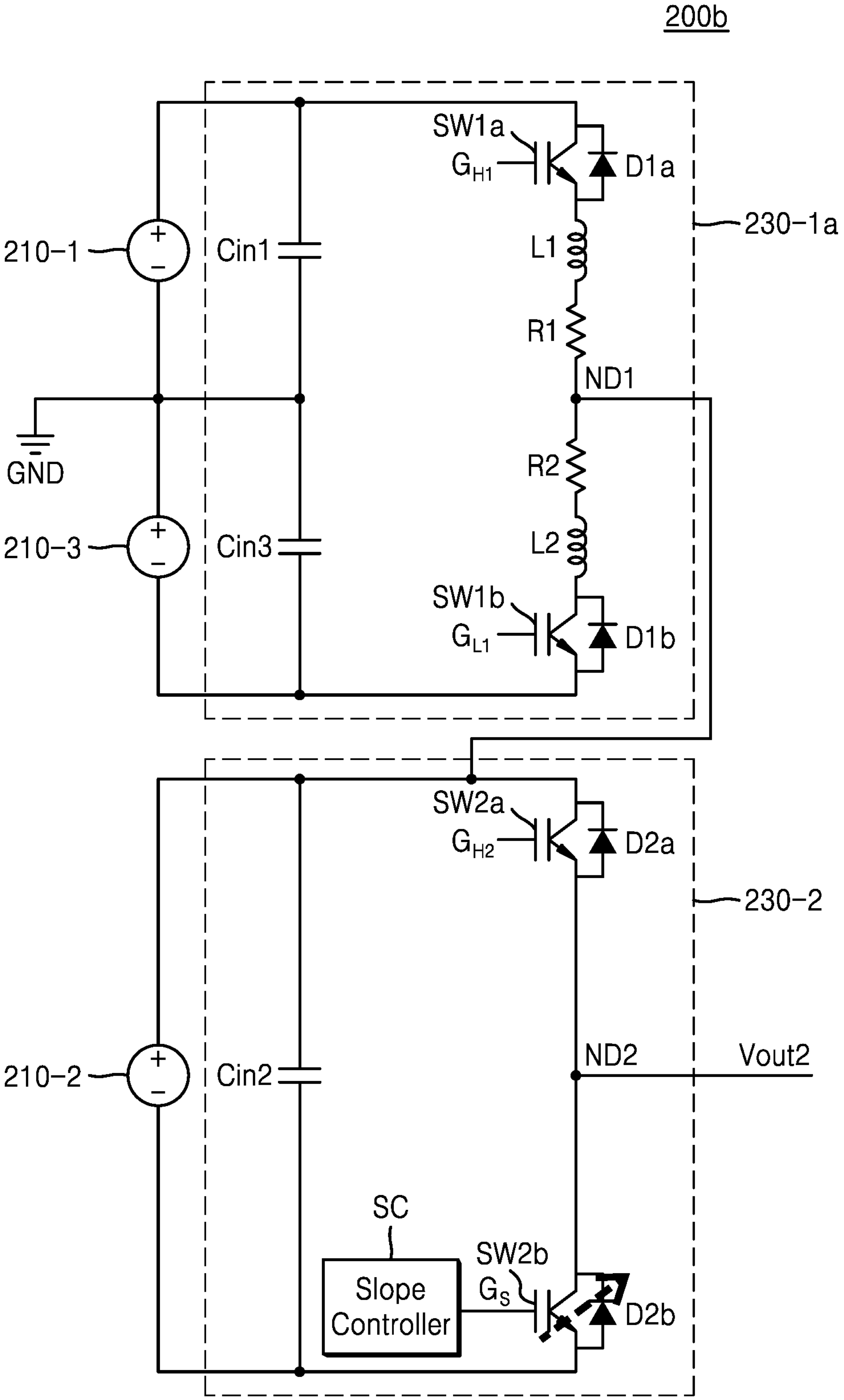
FIG. 3 is a circuit diagram of a second power generator according to another embodiment.

FIG. 3 is a circuit diagram of a second power generator 200*b* according to another embodiment. For convenience of explanation, differences from FIGS. 1A to 2B are mainly described while redundant descriptions therebetween are omitted.

Referring to FIG. 3, the second power generator 200*b* may include a pulse module 230-1*a* and the slope module 230-2. The slope module 230-2 of FIG. 3 is similar to and may be the same as the slope module 230-2 of FIG. 2B, and only the pulse module 230-1*a* is described below.

The pulse module 230-1*a* of FIG. 3, unlike the pulse module 230-1 of FIG. 2B, may include two DC power generators. The pulse module 230-1*a* may include the first DC power source 210-1 and a third DC power source 210-3. For example, the first DC power source 210-1 and the third DC power source 210-3 may generate a voltage of the same level. In another embodiment, the first DC power source 210-1 and the third DC power source 210-3 may generate voltage of different levels.

Furthermore, the third DC power source 210-3 may further include a third input capacitor Cin3. The third input capacitor Cin3 may serve as a filter for maintaining the DC voltage of the third DC power source 210-3.

The ground terminal GND of the pulse module 230-1*a* may be arranged between the first DC power source 210-1 and the third DC power source 210-3. The ground terminal GND may be connected to a negative terminal of the first DC power source 210-1 and a positive terminal of the third DC power source 210-3. For example, the first DC power source 210-1 may generate a positive voltage that is higher than a reference voltage (Vref of FIG. 5C), and the third DC power source 210-3 may generate a negative voltage that is lower than the reference voltage (Vref of FIG. 5C).

The second power generator 200*b* may generate a square wave by operating, for example, the pulse module 230-1*a* only. Furthermore, the second power generator 200*b* may generate a voltage having a slope waveform by operating the pulse module 230-1*a* and the slope module 230-2.

Figure 4:
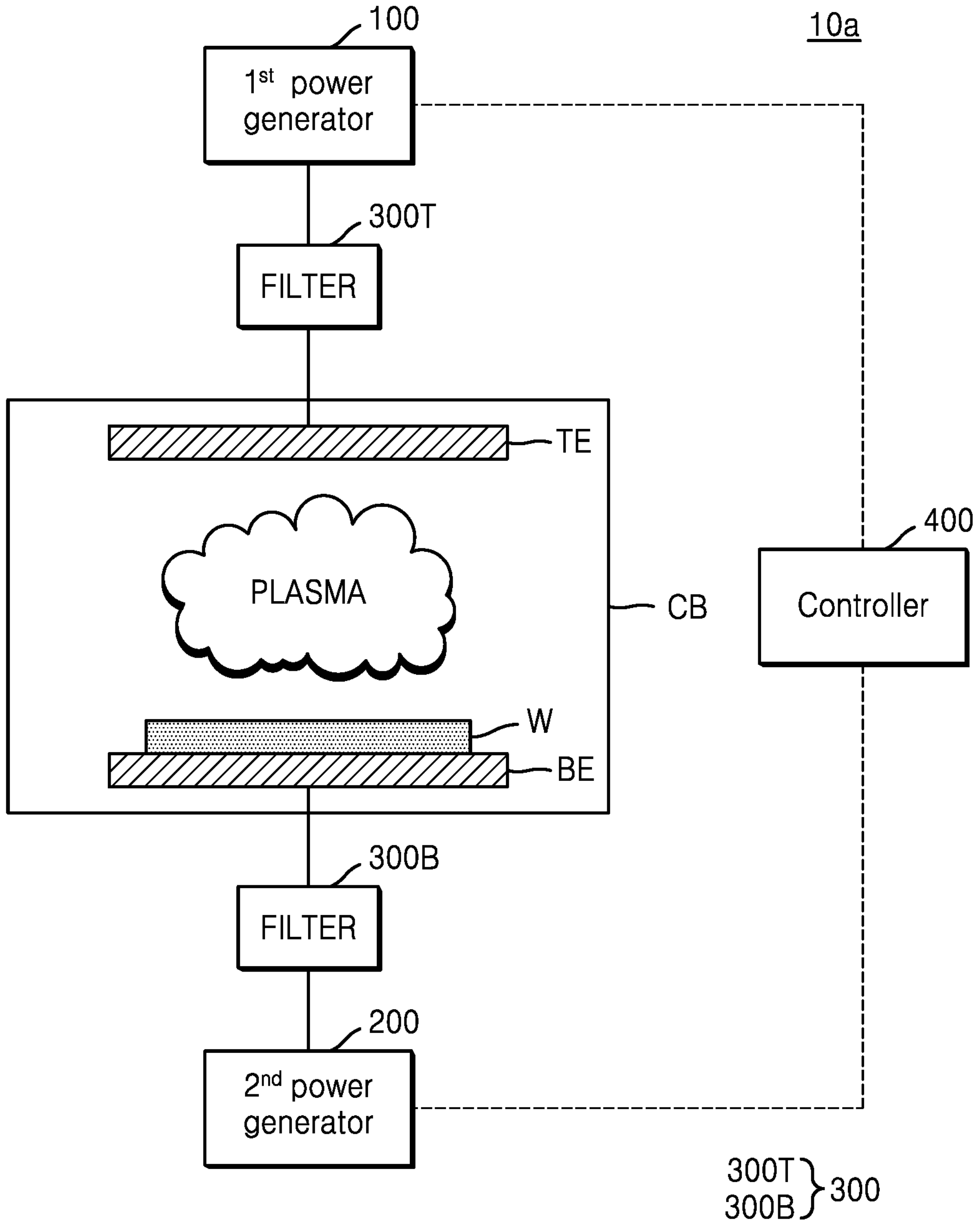
FIG. 4 is a schematic view for explaining an apparatus for processing plasma, according to an embodiment.

FIG. 4 is a schematic view for explaining an apparatus 10*a* for processing plasma according to an embodiment. For convenience of explanation, differences from FIGS. 1A to 1C are mainly described while redundant descriptions therebetween are omitted.

Referring to FIG. 4, the apparatus 10 for processing plasma may include the first power generator 100, the second power generator 200, the filter 300, and the controller 400. Unlike FIG. 1A, the first power generator 100 of the apparatus 10 for processing plasma may be connected to the top electrode TE. Accordingly, the first power generator 100 may transmit an RF voltage to the top electrode TE. For example, plasma may be generated by the first output voltage Vout1 provided to the top electrode TE.

The filter 300 may include an upper filter 300T and a lower filter 300B. The upper filter 300T may be arranged between the first power generator 100 and the top electrode TE, and the lower filter 300B may be arranged between the second power generator 200 and the bottom electrode BE. The lower filter 300B may include a similar, or the same configuration to the filter 300 of FIG. 1A, and may be operated according to a similar or the same method.

The upper filter 300T may block the second output voltage Vout2 to prevent the second output voltage Vout2 generated by the second power generator 200 from being applied to the first power generator 100, and may allow the first output voltage Vout1 to pass therethrough to allow the first output voltage Vout1 generated by the first power generator 100 to be applied to the top electrode TE. For example, the upper filter 300T may consist of a high pass filter, a band stop filter, or a combination thereof.

Figure 5A:
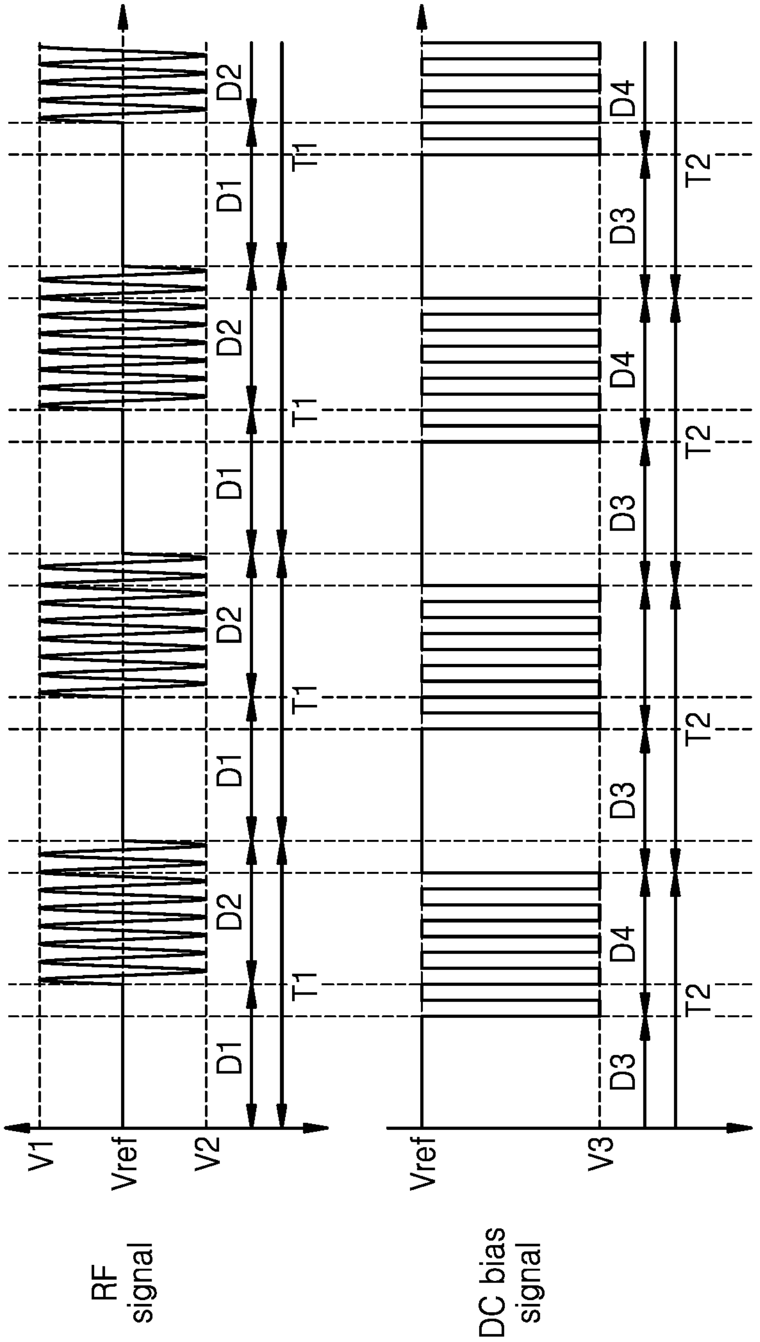
FIGS. 5A to 5D are schematic graphs for explaining the operation of an apparatus for processing plasma, according to embodiments.
Figure 5B:
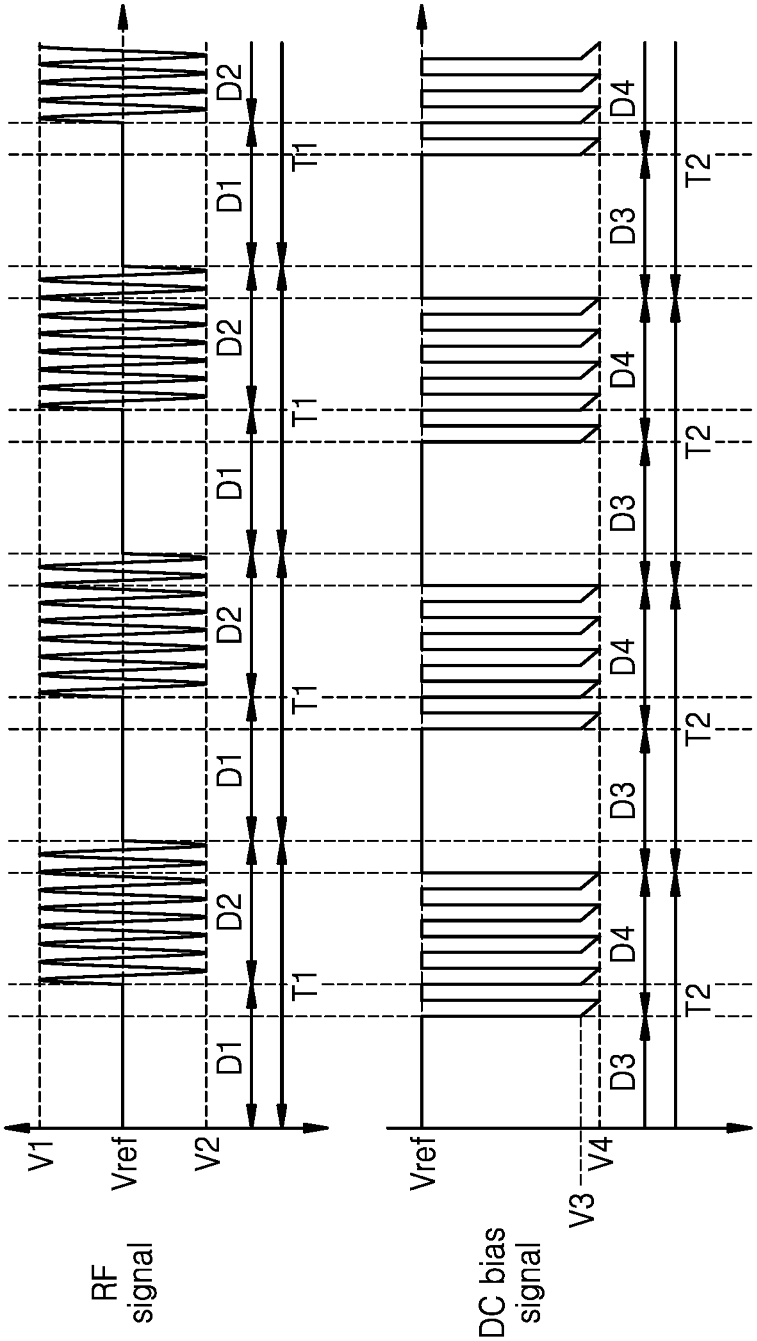
Figure 5C:
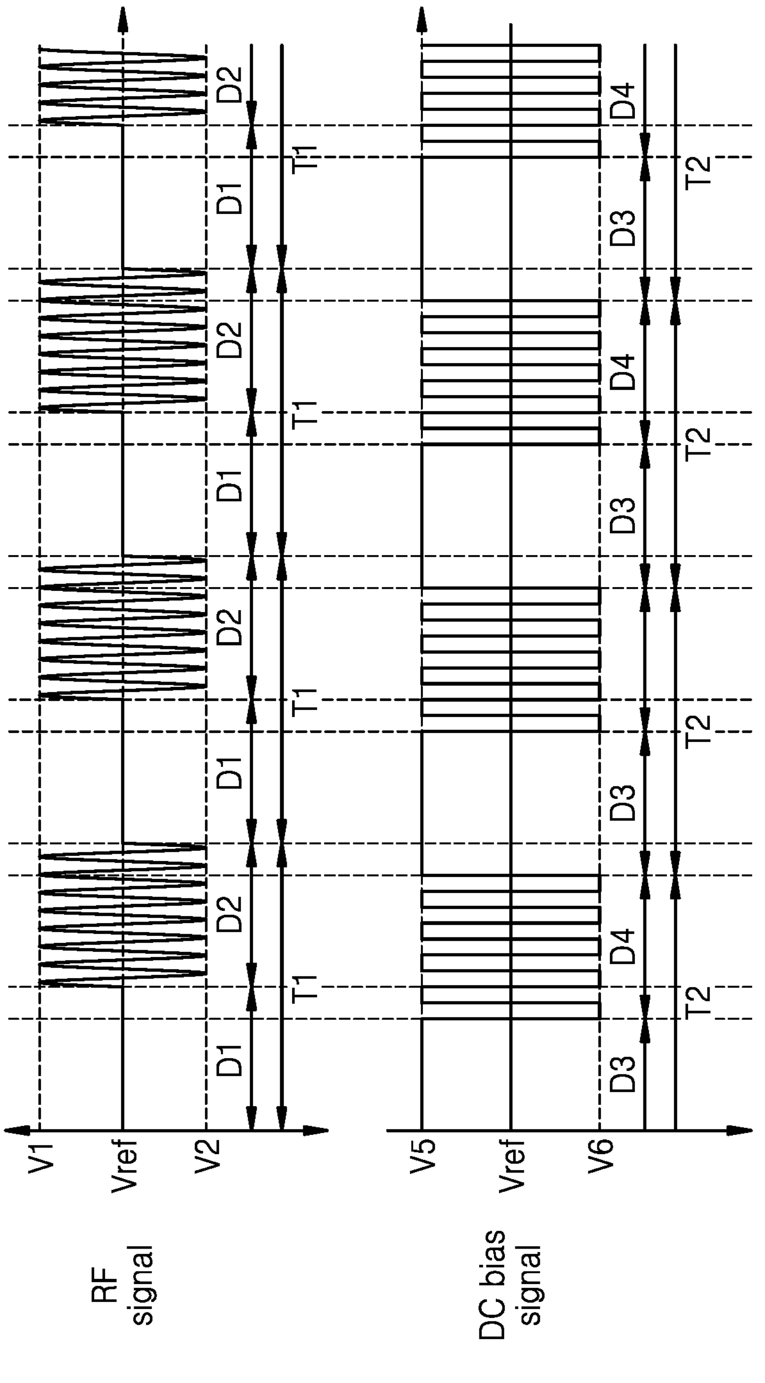
Figure 5D:
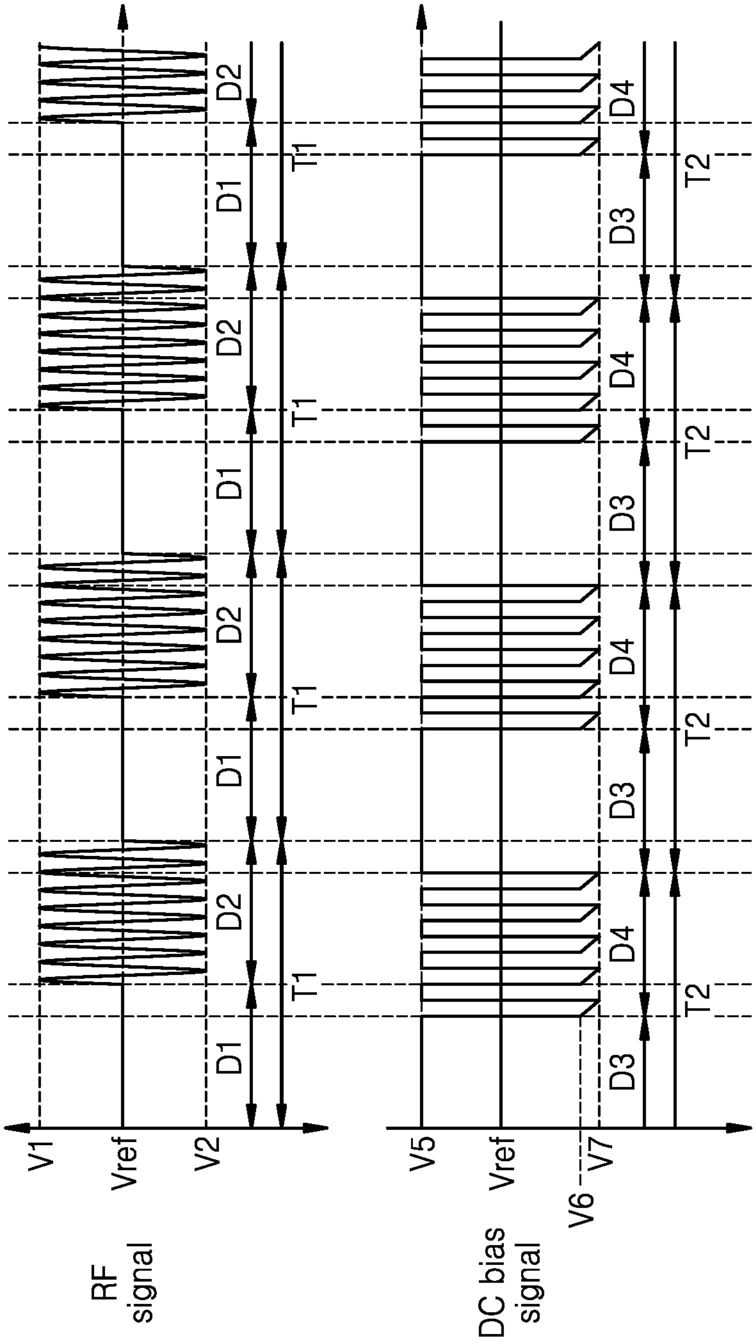
Figure 6A:
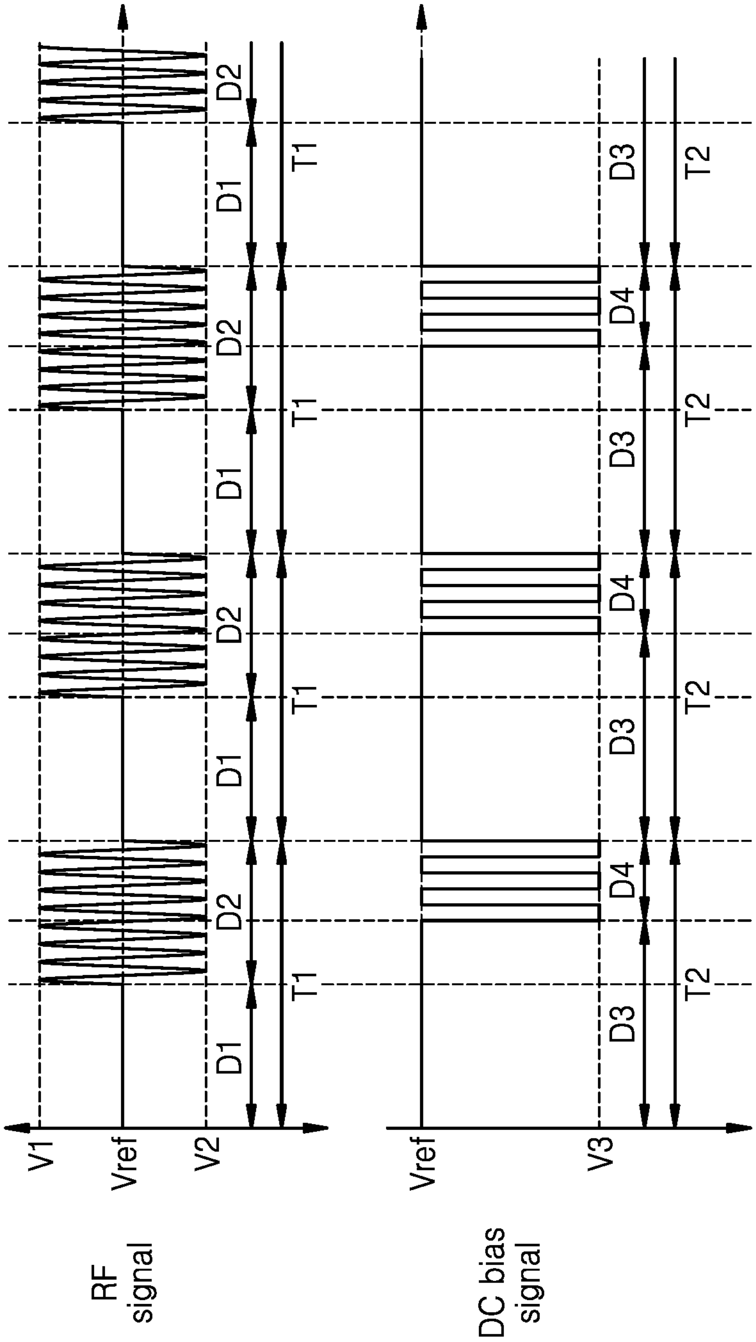
FIGS. 6A to 6D are schematic graphs for explaining the operation of an apparatus for processing plasma, according to an embodiment.
Figure 6B:
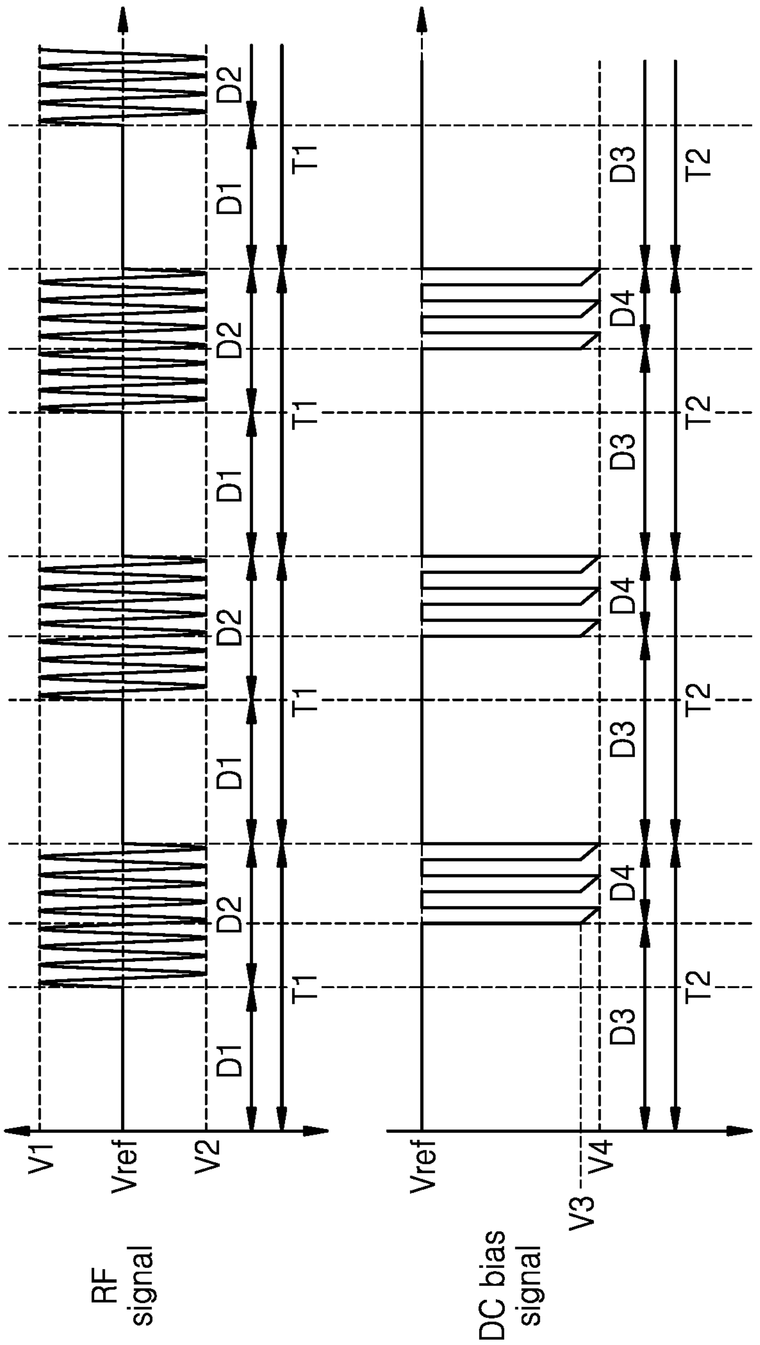
Figure 6C:
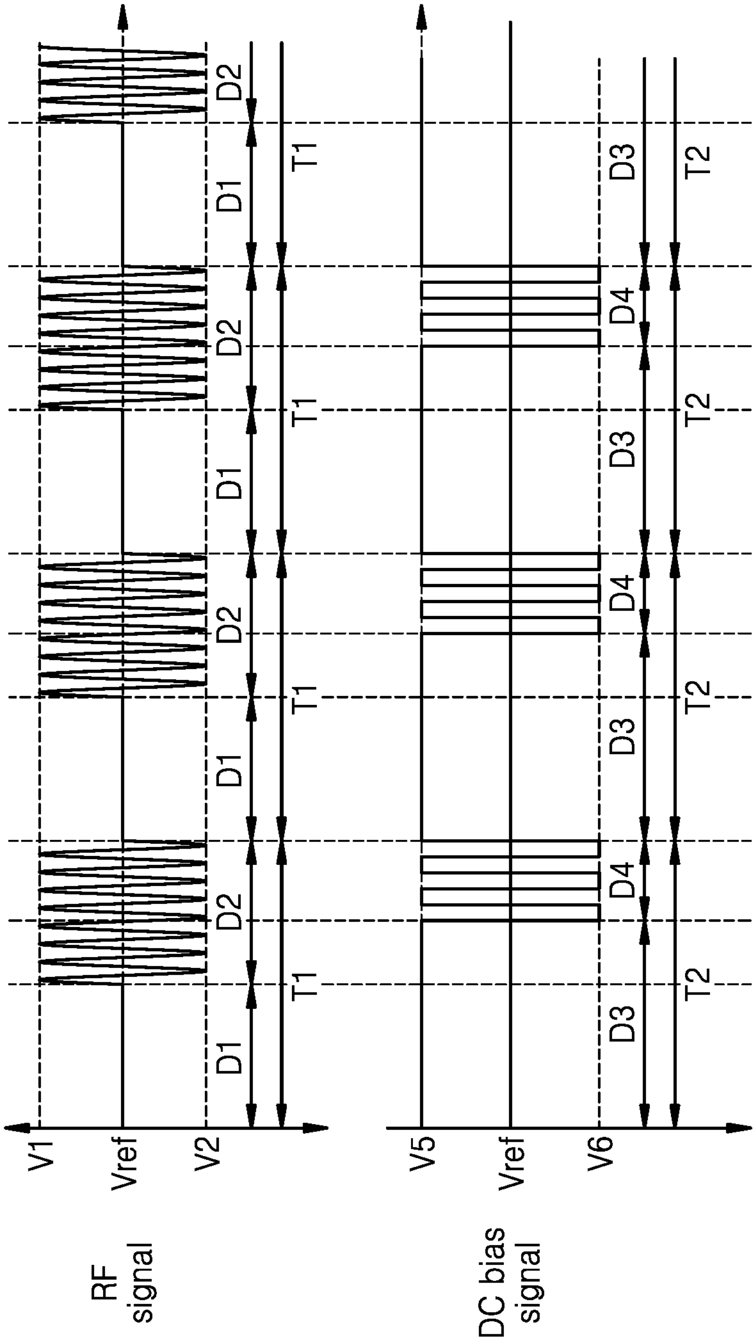
Figure 6D:
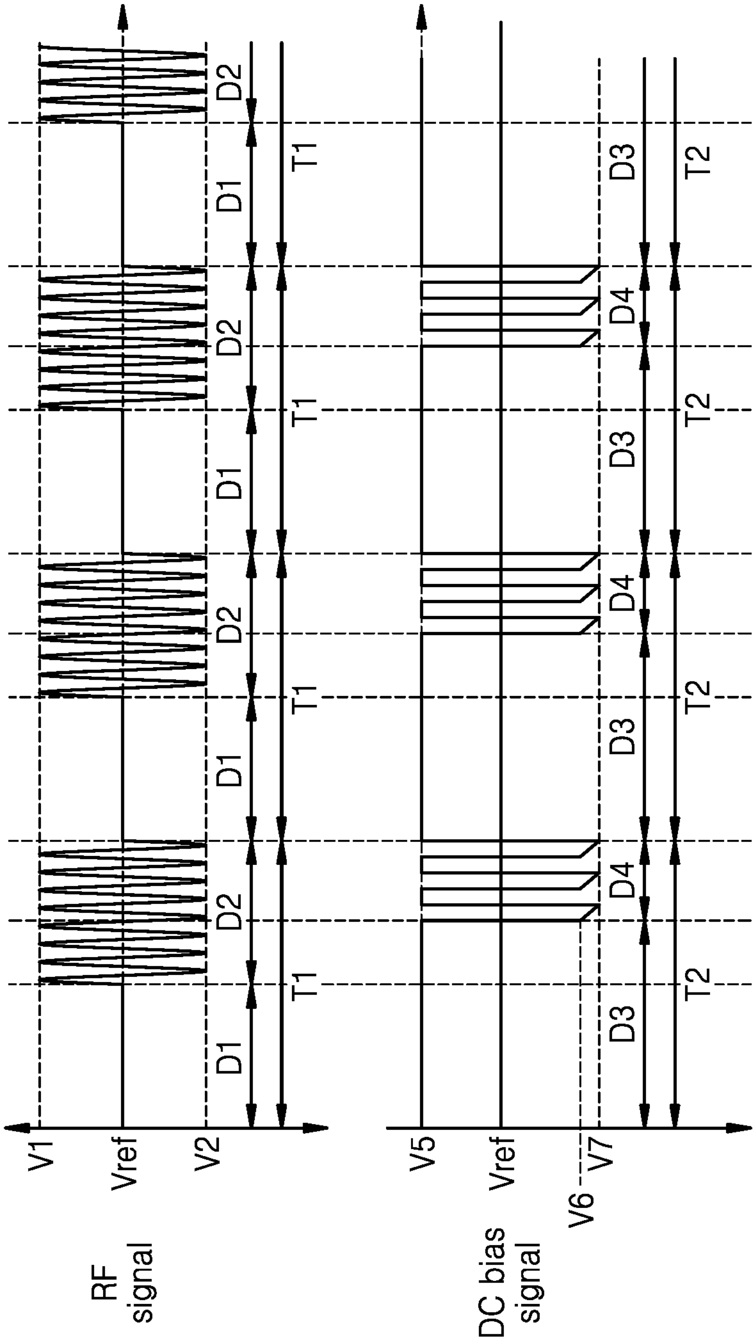
Figure 7A:
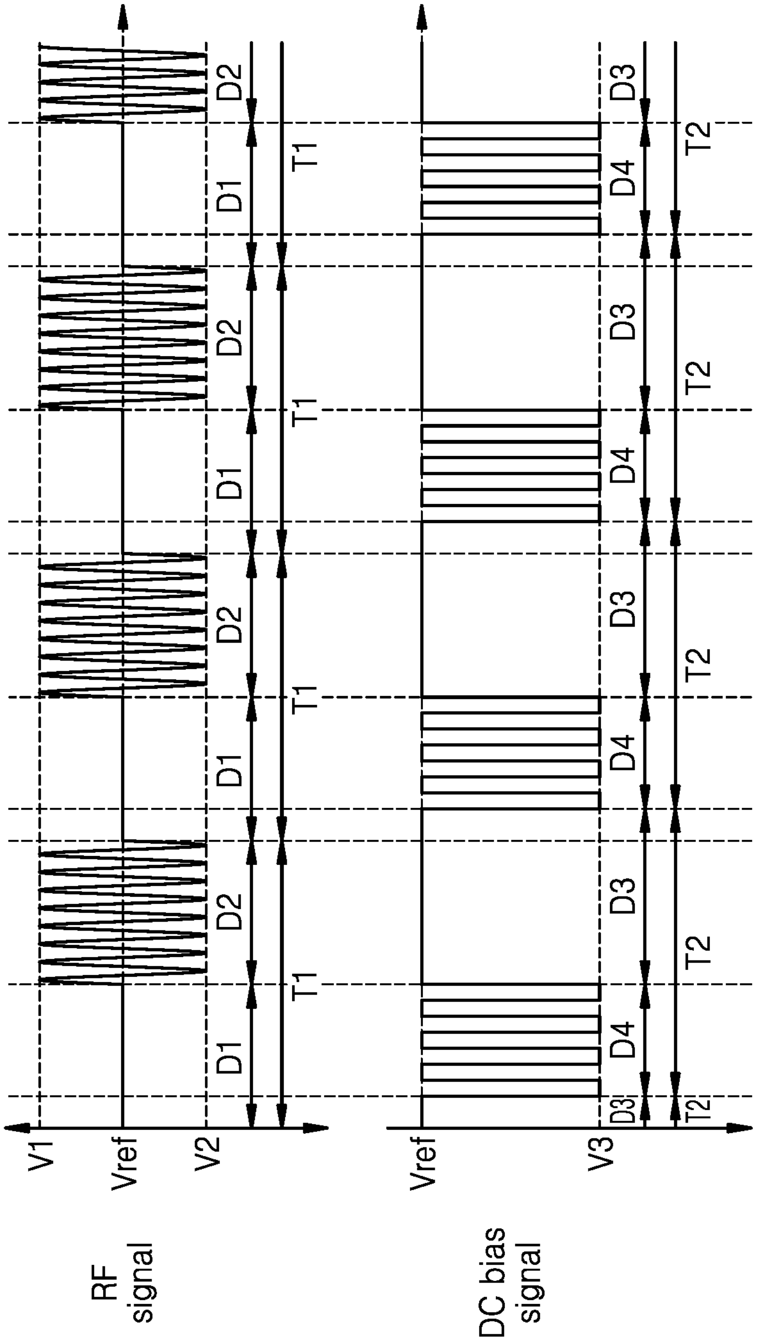
FIGS. 7A to 7D are schematic graphs for explaining the operation of an apparatus for processing plasma, according to an embodiment.
Figure 7B:
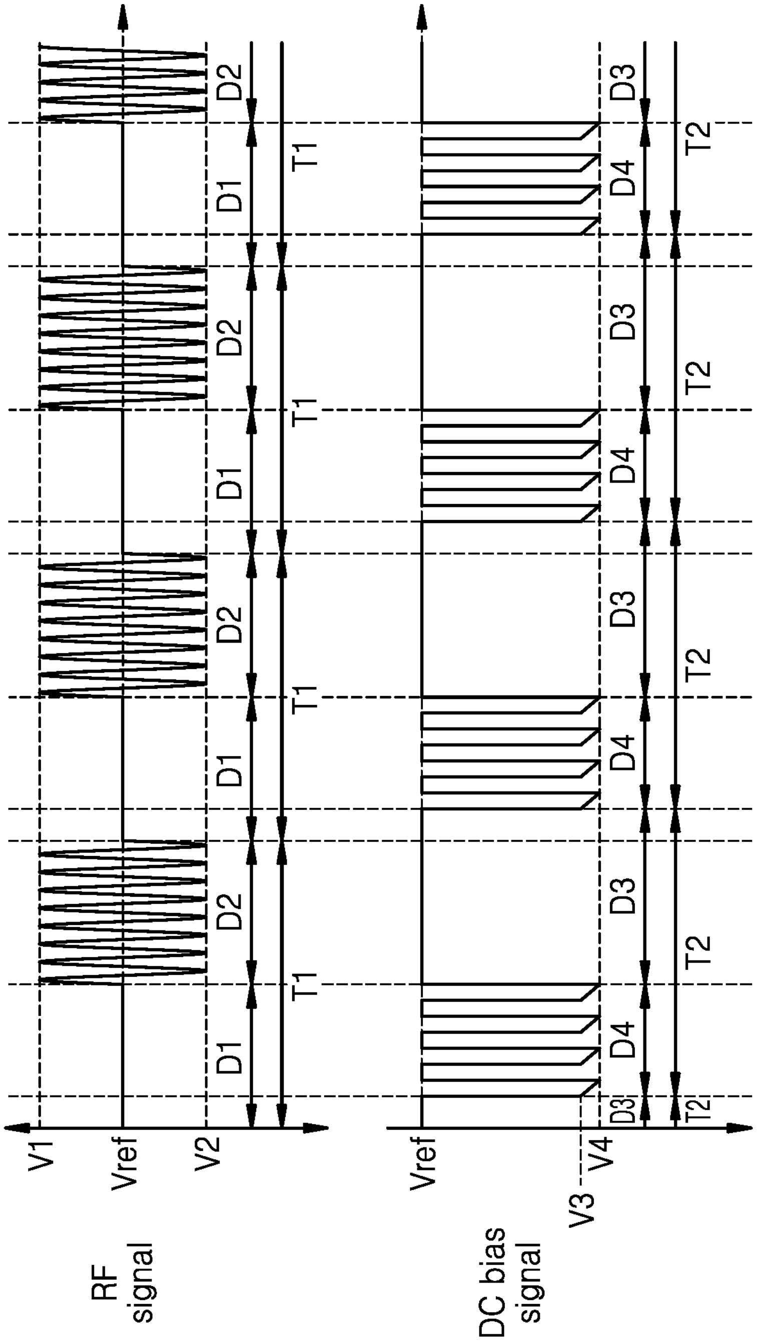
Figure 7C:
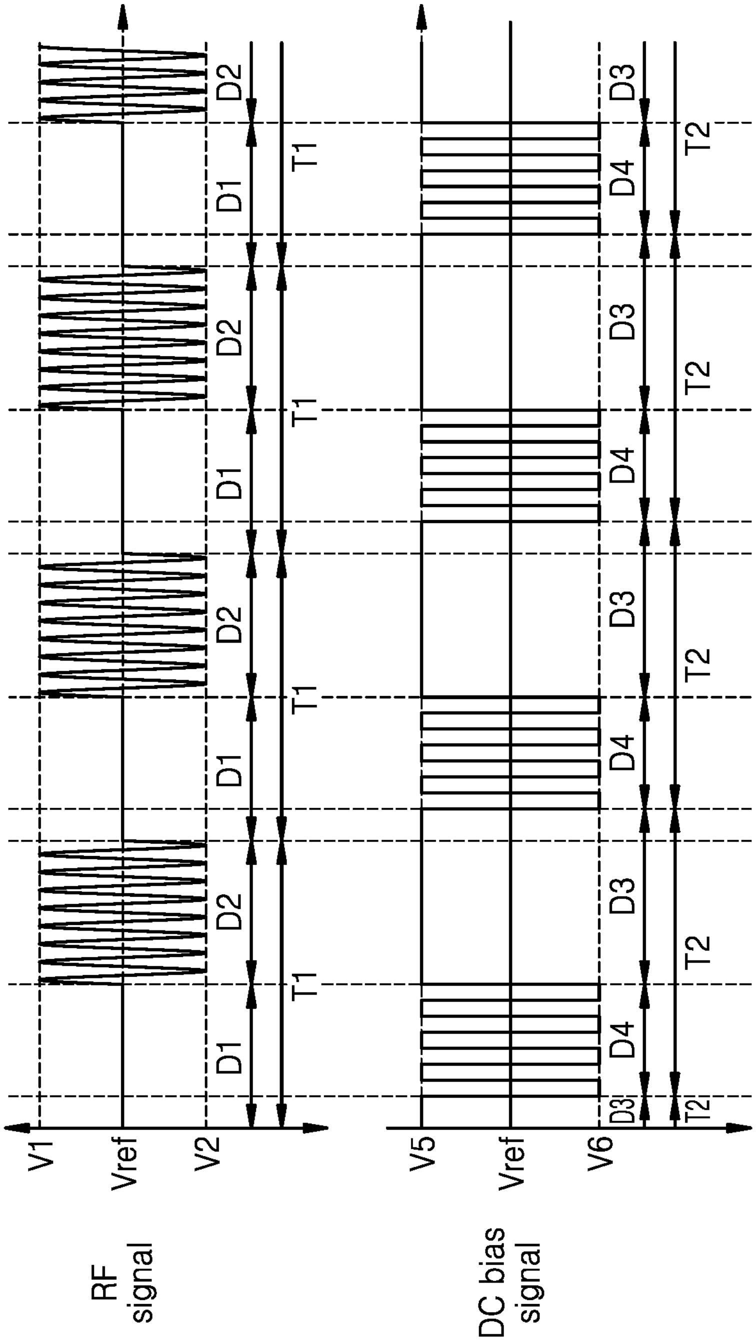
Figure 7D:
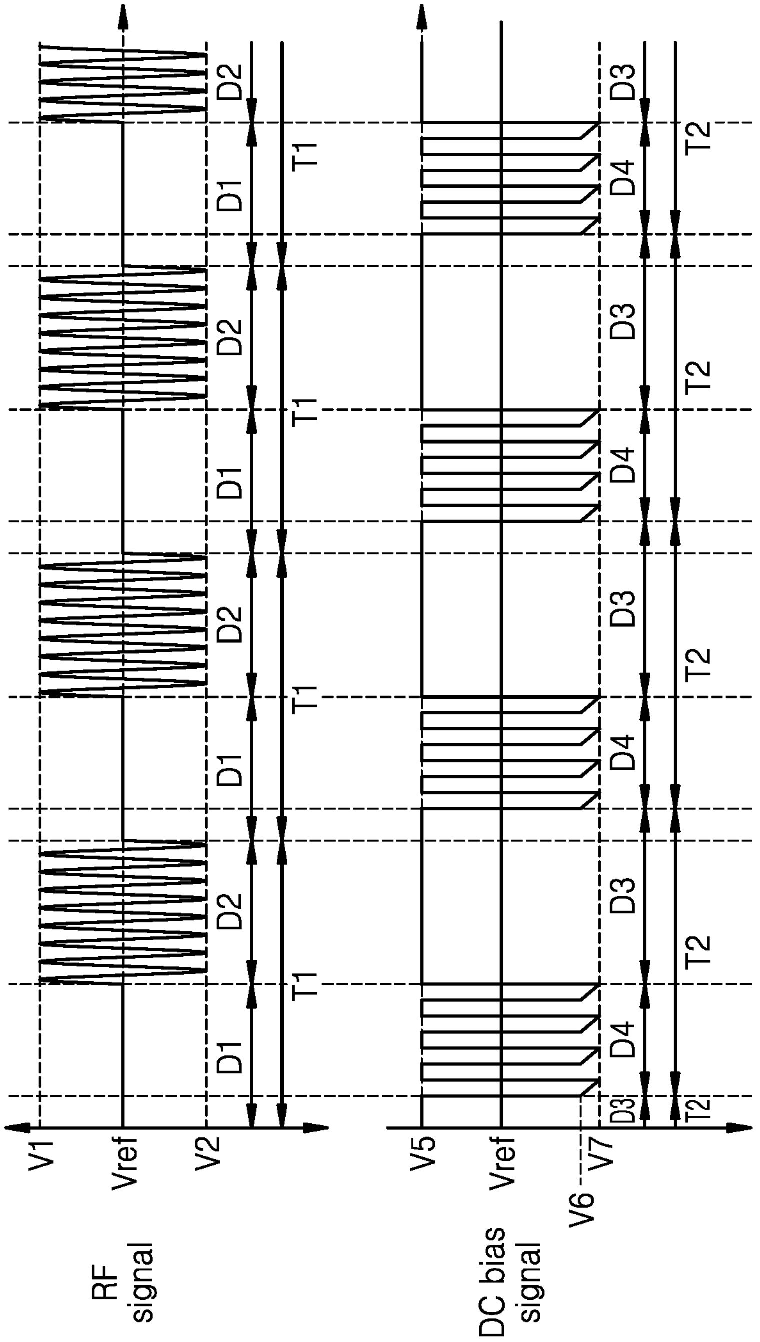
Figure 8A:
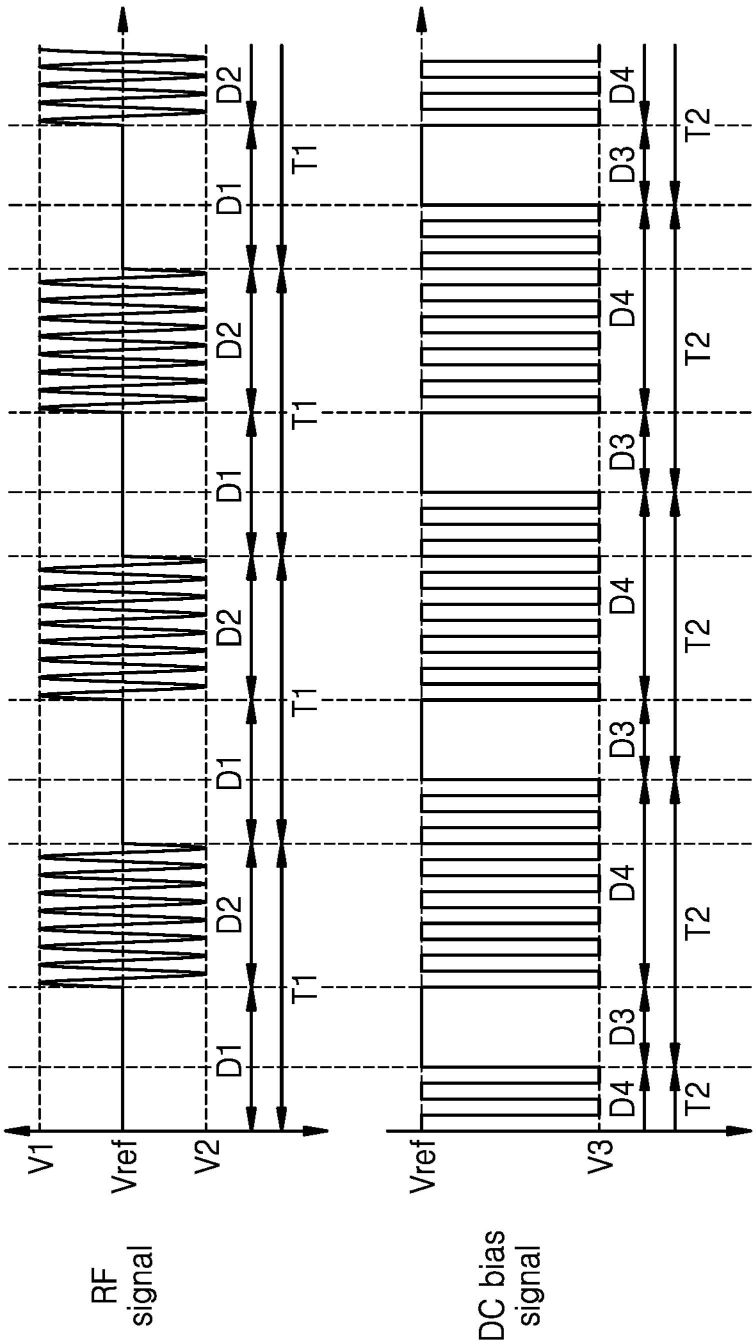
FIGS. 8A to 8D are schematic graphs for explaining the operation of an apparatus for processing plasma, according to an embodiment.
Figure 8B:
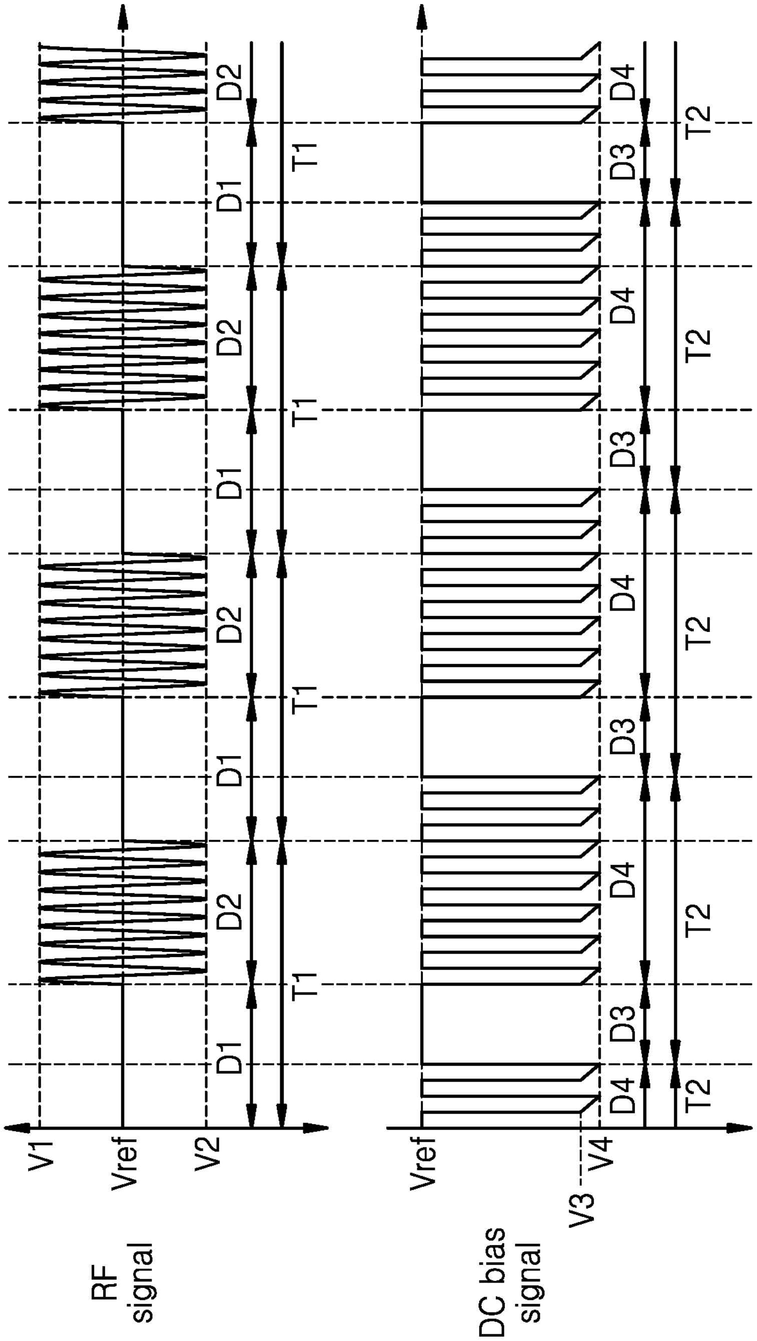
Figure 8C:
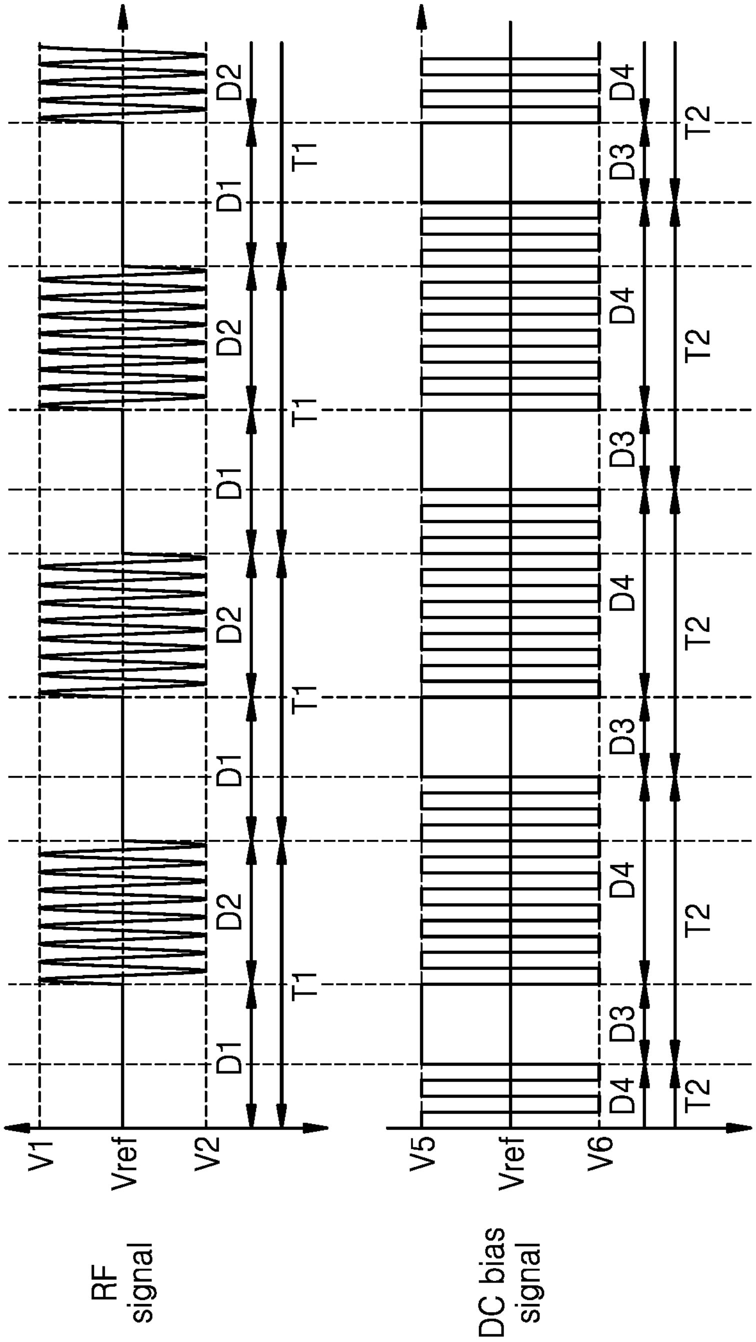
Figure 8D:
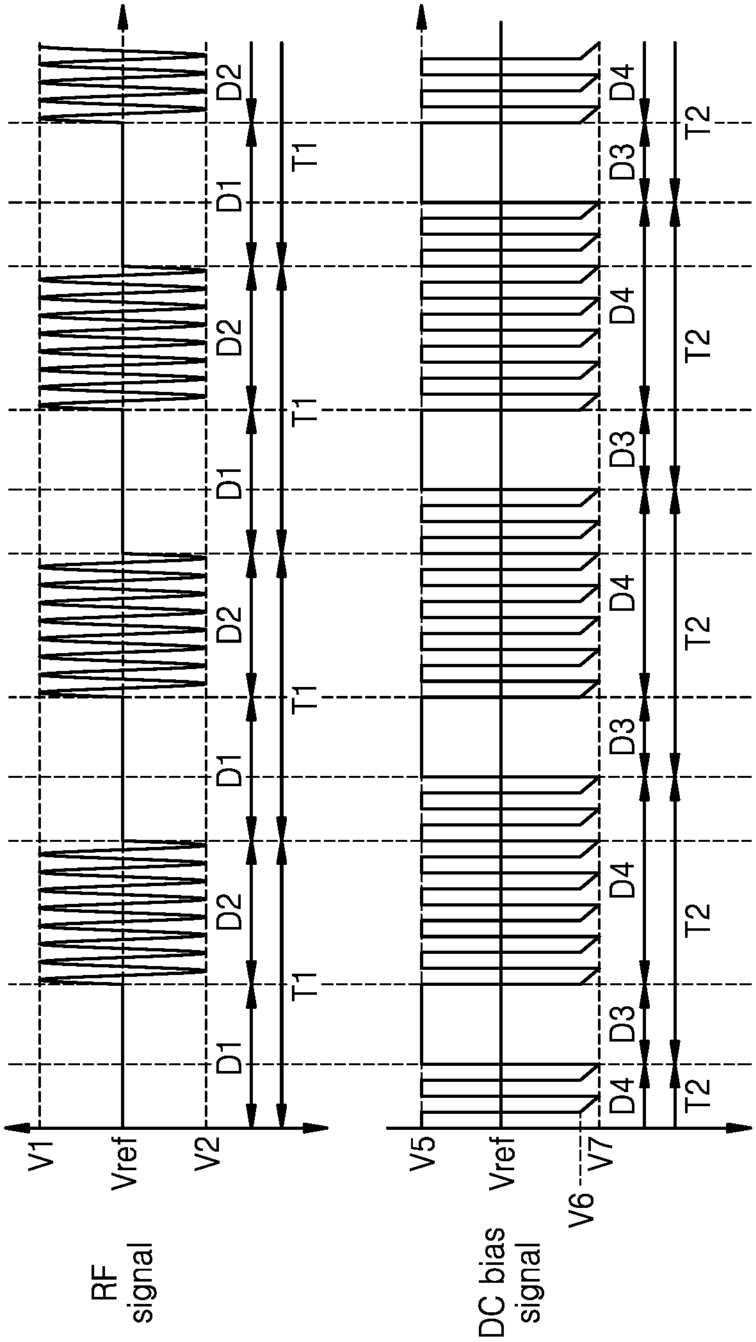
Figure 9A:
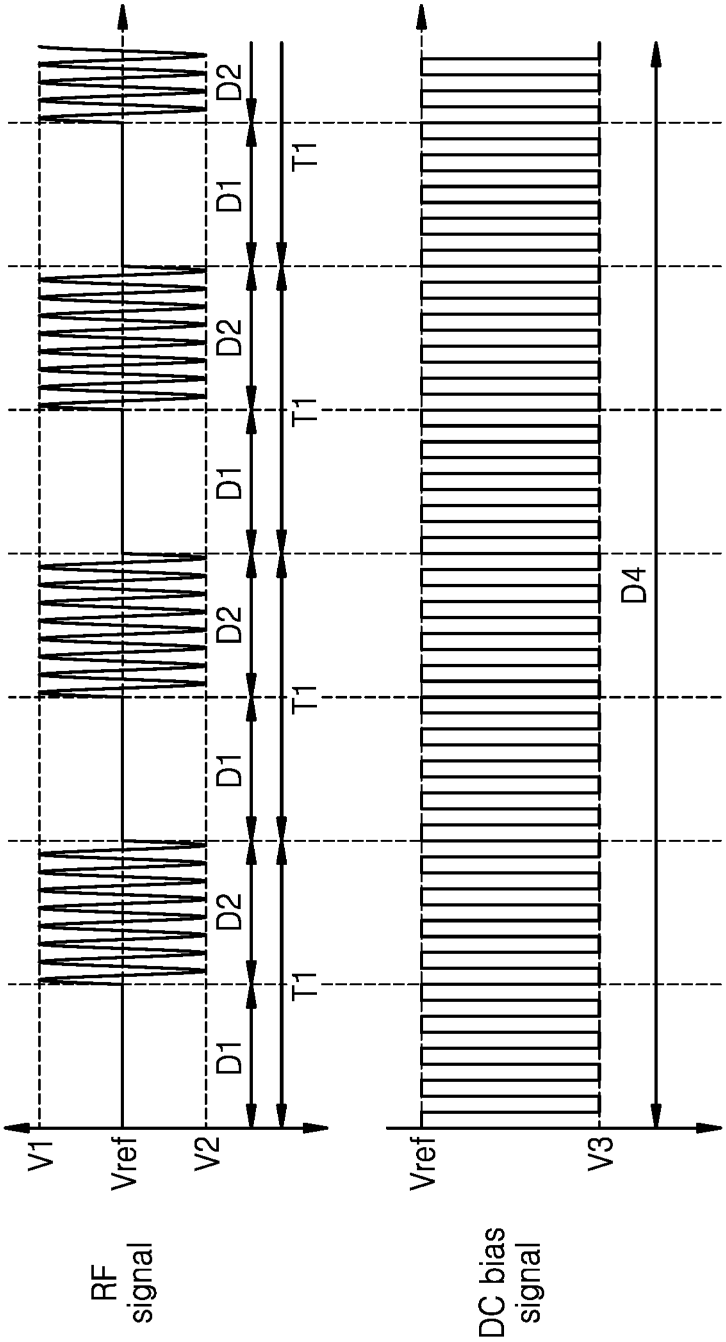
FIGS. 9A to 9D are schematic graphs for explaining the operation of an apparatus for processing plasma, according to an embodiment.
Figure 9B:
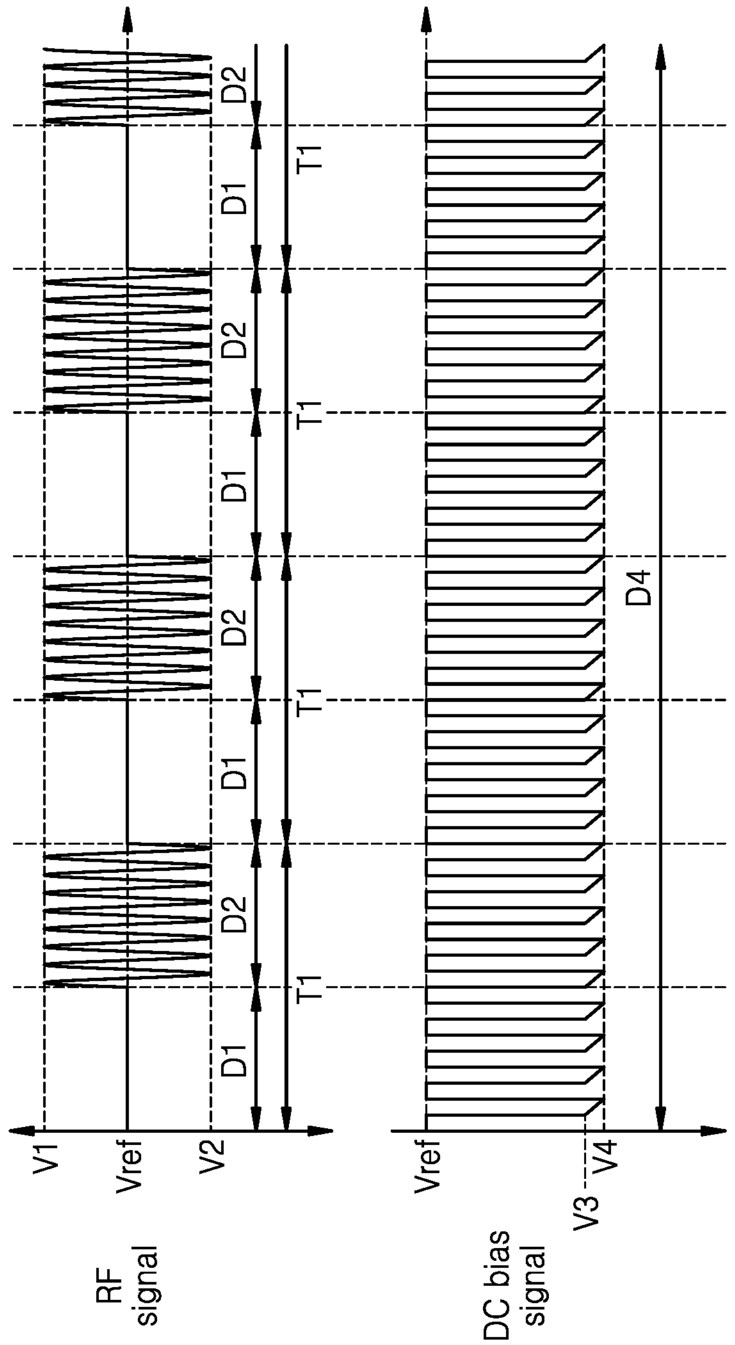
Figure 9C:
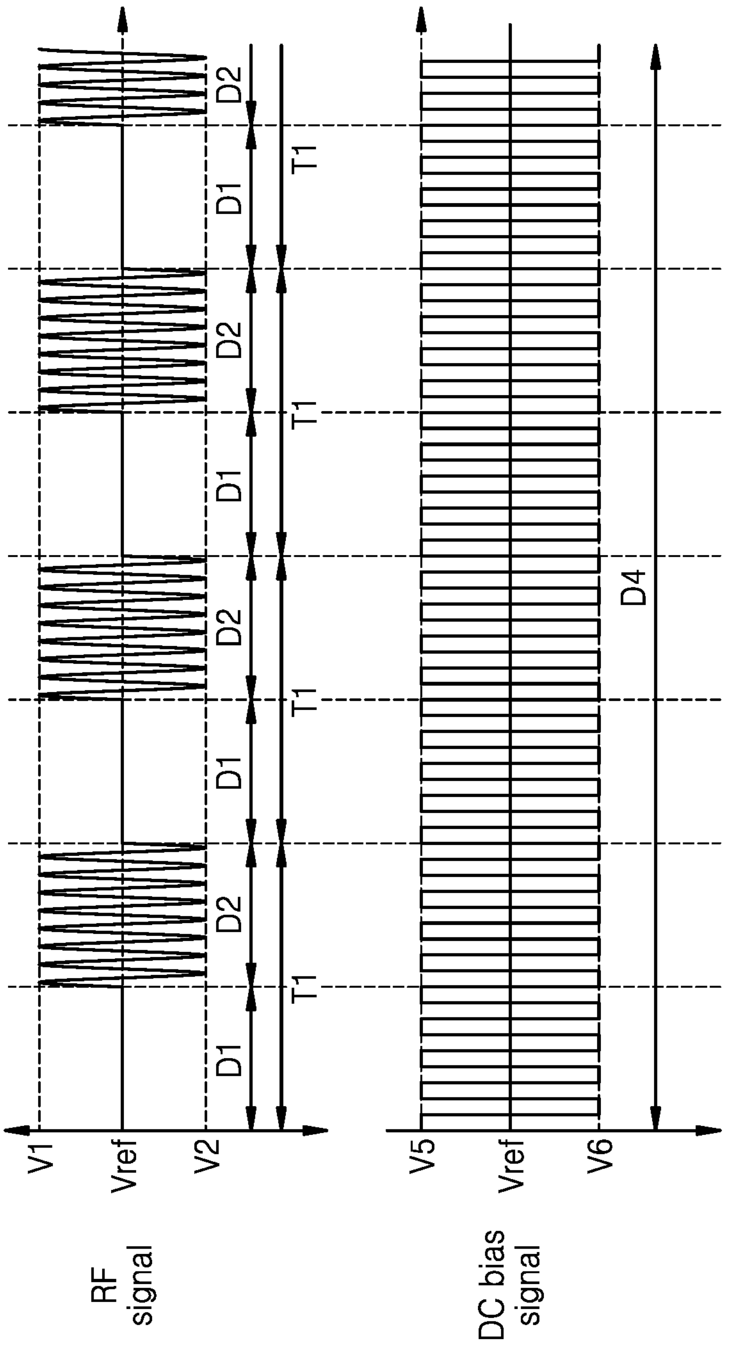
Figure 9D:
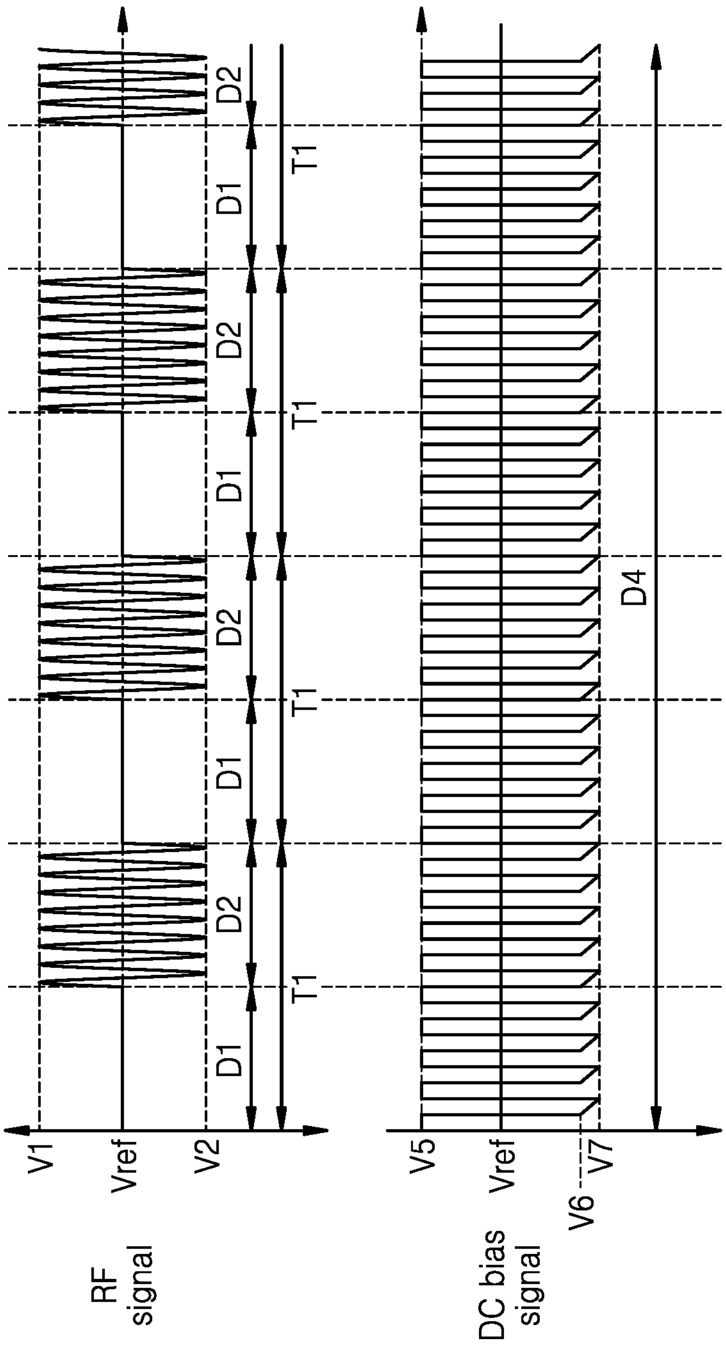

FIGS. 5A to 5D are schematic graphs for explaining the operation of an apparatus for processing plasma, according to embodiments. In detail, FIG. 5A is a graph schematically showing signals generated by the first power generator 100 and the second power generator 200 of FIG. 1A. FIG. 5B is a graph schematically showing signals generated by the first power generator 100 of FIG. 1A and the second power generator 200*a* of FIG. 2A. FIGS. 5C and 5D are graphs schematically showing signals generated by the second power generator 200*b* of FIG. 3. FIG. 5C is a graph showing a case in which only the pulse module 230-1*a* of the second power generator 200*b* is operated, and FIG. 5D is a graph showing a case in which both of the pulse module 230-1*a* and the slope module 230-2 of the second power generator 200*b* are operated.

Referring to FIGS. 5A to 5D, graphs show, in order from the top, changes of an RF signal and a DC bias signal over time. In each graph, the vertical axis indicates a voltage value, the horizontal axis indicates time, and the graphs are aligned with each other such that the same position on the horizontal axis indicates the same time point.

Referring to FIGS. 1A and 5A, the first power generator 100 may generate an RF signal and apply the generated RF signal to the chamber CB, and the second power generator 200 may generate a DC bias signal and apply the generated DC bias signal to the chamber CB.

Referring to FIGS. 1A, 2A, and 5B, the first power generator 100 may generate an RF signal and apply the generated RF signal to the chamber CB, and the second power generator 200*a* may generate a DC bias signal and apply the generated DC bias signal to the chamber CB.

Referring to FIGS. 1A, 3, 5C, and 5D, the first power generator 100 may generate an RF signal and apply the generated RF signal to the chamber CB, and the second power generator 200*b* may generate a DC bias signal and apply the generated DC bias signal to the chamber CB.

According to embodiments, the RF signal generated by the first power generator 100 may be a chopped or pulsed sinusoidal signal. The chopped or pulsed sinusoidal signal means that a sinusoidal frequency having a certain frequency is turned on or off by a chopping frequency that is less than the sinusoidal frequency.

According to embodiments, the RF signal may be turned on or off at a first cycle T1. The first cycle T1 may include a first section D1 (also described as a first time section) in which the RF signal is turned off and a second section D2 (also described as a second time section) in which the RF signal is turned on. The first section D1 and the second section D2 may arrive alternately and repeatedly. The first section D1 may be an off duty portion, and the second section D2 may be an on duty portion. According to embodiments, the length of the first section D1 and the length of the second section D2 may be substantially the same. According to embodiments, the chopping frequency may be within a range of about 100 kHz to about 3 MHz. According to embodiments, the chopping frequency may be within a range of about 400 kHz to about 2 MHz. The chopping frequency may be defined as a reciprocal of the first cycle T1.

The RF signal may be turned off during the first section D1 so as to have a reference voltage Vref value. The reference voltage Vref, which is a voltage used as a reference to other voltages, may be, for example, 0 V. The RF signal may have, during the second section D2, a frequency greater than the chopping frequency, for example, a sinusoidal voltage value having a frequency of about 40 MHz to about 200 MHz. The RF signal may be a sinusoidal voltage varying between a first voltage V1 and a second voltage V2. The first voltage V1 may be a voltage greater than the reference voltage Vref, and the second voltage V2 may be a voltage less than the reference voltage Vref. A difference between the first voltage V1 and the reference voltage Vref may be substantially the same as a difference between the second voltage V2 and the reference voltage Vref, but the disclosure is not limited thereto. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

A second cycle T2 may include a third section D3 (also described as a third time section) in which the non-sinusoidal low frequency signal is either the reference voltage Vref or greater than the reference voltage Vref and a fourth section D4 (also described as a fourth time section) in which a non-sinusoidal low frequency signal is less than the reference voltage Vref or is both greater than and less than the reference voltage Vref. In some embodiments, the lengths of the third section D3 and the fourth section D4 may be substantially the same. The third section D3 and the fourth section D4 may arrive alternately and repeatedly.

FIG. 5A illustrates an example in which the non-sinusoidal DC bias signal generated by the second power generator 200 is a non-sinusoidal signal, for example, a square wave, changing at the second cycle T2 (e.g., to have an on-off cycle having a period of T2). FIG. 5B illustrates an example in which the non-sinusoidal DC bias signal generated by the second power generator 200 has a different negative voltage in the fourth section D4. For example, in the fourth section D4, the non-sinusoidal DC bias signal may have a voltage value between a third voltage V3 and a fourth voltage V4. For example, in the fourth section D4, the waveform during the negative voltage portion of the non-sinusoidal DC bias signal may have a slope.

FIG. 5C illustrates an example in which the non-sinusoidal DC bias signal of the second power generator 200*b* is a non-sinusoidal signal, for example, a square wave, changing at the second cycle T2 (e.g., to have an on-off cycle having a period of T2). FIG. 5D illustrates an example in which the non-sinusoidal DC bias signal of the second power generator 200*b* has a different negative voltage in the fourth section D4. For example, in the fourth section D4, the non-sinusoidal DC bias signal may have a voltage value between a sixth voltage V6 and a seventh voltage V7. For example, in the fourth section D4, the waveform during the negative voltage portion of the non-sinusoidal DC bias signal may have a slope. In FIGS. 5C and 5D, the reference voltage Vref may have an average value between a fifth voltage V5 and the sixth voltage V6.

FIGS. 5A and 5B illustrate an example of having a unidirectional voltage such that the third voltage V3 and the fourth voltage V4 are lower than the reference voltage Vref, and FIGS. 5C and 5D illustrate an example of having a bidirectional voltage such that the fifth voltage V5 is higher than the reference voltage Vref and the sixth voltage V6 and the seventh voltage V7 are lower than the reference voltage Vref. Furthermore, in FIGS. 5C and 5D, when the DC bias signal is in the on duty, a voltage higher than the reference voltage Vref and a voltage lower than the reference voltage Vref may be alternately repeated. When the reference voltage Vref is 0 V, FIGS. 5A and 5B illustrates an example of having a unidirectional negative voltage such that the third voltage V3 and the fourth voltage V4 are negative voltages, and FIGS. 5C and 5D illustrate an example of having a bidirectional voltage such that the fifth voltage V5 is a positive voltage and the sixth voltage V6 and the seventh voltage V7 are negative voltages.

As an example, although a difference between the reference voltage Vref and the third voltage V3 of FIG. 5A is the same as a difference between the fifth voltage V5 and the sixth voltage V6 of FIG. 5C, this is an example and the disclosure is not limited thereto. In another embodiment, the difference between the reference voltage Vref and the third voltage V3 of FIG. 5A may different from the difference between the fifth voltage V5 and the sixth voltage V6 of FIG. 5C. For example, the difference between the reference voltage Vref and the third voltage V3 of FIG. 5A may be half the difference between the fifth voltage V5 and the sixth voltage V6 of FIG. 5C.

The RF signal and the non-sinusoidal DC bias signal may be offset from each other. For example, the apparatus 10 for processing plasma may separate the RF signal and the non-sinusoidal DC bias signal from each other in terms of time. In detail, the time point when the RF signal is turned on and the time point when the non-sinusoidal DC bias signal is turned on may not coincide with each other (e.g., may not be the same time point), and/or the time point when the RF signal is turned off and the time point when the non-sinusoidal DC bias signal is turned off may not coincide with each other (e.g., may not be the same time point). Furthermore, the time point when the RF signal is turned on and the time point when the non-sinusoidal DC bias signal is turned off may not coincide with each other (e.g., may not be the same time point), and/or the time point when the RF signal is turned on and the time point when the non-sinusoidal DC bias signal is turned off may not coincide with each other (e.g., may not be the same time point). The DC bias signal may be described as having a non-sinusoidal portion, which is a non-sinusoidal periodic signal in the on state, and having an off state or steady state, during which the non-sinusoidal periodic signal is off, for example and a steady voltage is output. The DC bias signal may be described as being in the on state (or being on) when it has the non-sinusoidal form, and being in the off state (or being off) when it is in the steady state. Similarly, the RF signal may be described as having a sinusoidal portion, which is a sinusoidal periodic signal in the on state, and having an off state or steady state, during which the sinusoidal periodic signal is off, for example, and a steady voltage is output. The RF signal may be described as being in the on state (or being on) when it has the sinusoidal form, and being in the off state (or being off) when it is in the steady state.

When both of the RF signal and the DC bias signal are in an on state, an etching process may be performed on the wafer W. Furthermore, when the RF signal is in an on state, and the DC bias signal is in an off state, the deposition process may be performed on the wafer W. The apparatus 10 for processing plasma according to some embodiments of the inventive concept may increase the time of the deposition process performed on the wafer W, by offsetting the RF signal and the DC bias signal.

Each of the first and second sections D1 and D2 may partially overlap each of the third and fourth sections D3 and D4. FIGS. 5A to 5D illustrate that a section in which the first section D1 overlaps the third section D3 is greater than a section in which the first section D1 overlaps the fourth section D4, but the disclosure is not limited thereto. For example, a section in which the first section D1 overlaps the third section D3 may be equal to or less than a section in which the first section D1 overlaps the fourth section D4.

According to embodiments, the first section D1 may overlap each of the third and fourth sections D3 and D4. Accordingly, the RF signal may be switched from an off state to an on state while the non-sinusoidal DC bias signal maintains an on-duty state. According to embodiments, the second section D2 may overlap each of the third and fourth sections D3 and D4. Accordingly, the RF signal may be switched from an on state to an off state while the non-sinusoidal DC bias signal maintains the reference voltage Vref. In an example, the second section D2 may overlap about 1% to about 99% of the third section D3. In another example, the second section D2 may overlap about 1% to about 99% of the fourth section D4.

FIGS. 6A to 6D are schematic graphs for explaining the operation of an apparatus for processing plasma, according to an embodiment. For convenience of explanation, differences from FIGS. 1A to 5D are mainly described while redundant descriptions therebetween are omitted.

Referring to FIGS. 6A to 6D, the first cycle T1 and the second cycle T2 may have substantially the same period. According to embodiments, the lengths of the third section D3 and the fourth section D4 may be different from each other. According to embodiments, the length of the third section D3 in which the non-sinusoidal DC bias signal is in the off duty (e.g., off state) may be longer than the length of the fourth section D4 in which the non-sinusoidal DC bias signal is in the on duty (e.g., on state). The length of the third section D3 may be longer than the lengths of the first and second sections D1 and D2. The length of the fourth section D4 may be shorter than the lengths of the first and second sections D1 and D2.

The fourth section D4 may overlap the second section D2, but not overlap the first section D1. Accordingly, the non-sinusoidal DC bias signal may be turned on while the RF signal maintains an on-duty state. Furthermore, the non-sinusoidal DC bias signal may not be turned off while the RF signal maintains the reference voltage Vref. However, the disclosure is not limited thereto, and for example, depending on the phase of the non-sinusoidal DC bias signal, the fourth section D4 may overlap the first section D1, or the fourth section D4 may overlap each of the first and second sections D1 and D2. When the fourth section D4 overlaps each of the first and second sections D1 and D2, the fourth section D4 may overlap a transition time point from the first section D1 to the second section D2, or a transition time point from the second section D2 to the first section D1.

FIGS. 7A to 7D are schematic graphs for explaining the operation of an apparatus for processing plasma, according to an embodiment. For convenience of explanation, differences from FIGS. 1A to 6*d* are mainly described while redundant descriptions therebetween are omitted.

Referring to FIGS. 7A to 7D, the first cycle T1 and the second cycle T2 may have substantially the same period. According to embodiments, the third section D3 and the length of the fourth section D4 may be different from each other. According to embodiments, the length of the third section D3 in which the non-sinusoidal DC bias signal is in an off duty may be longer than the length of the fourth section D4 in which the non-sinusoidal DC bias signal is in an on duty. The length of the third section D3 may be longer than the lengths of the first and second sections D1 and D2. The length of the fourth section D4 may be shorter than the lengths of the first and second sections D1 and D2.

According to embodiments, the second section D2 may overlap the third section D3, but not overlap the fourth section D4. Accordingly, during the third section D3 in which the non-sinusoidal DC bias signal is the reference voltage Vref, the RF signal may be in an on state.

According to embodiments, the fourth section D4 may overlap the first section D1, but not overlap the second section D2. Accordingly, during the fourth section D4 in which the non-sinusoidal DC bias signal is in an on state, the RF signal may be in an off state.

FIGS. 8A to 8D are schematic graphs for explaining the operation of an apparatus for processing plasma, according to an embodiment. For convenience of explanation, differences from FIGS. 1A to 7D are mainly described while redundant descriptions therebetween are omitted.

Referring to FIGS. 8A to 8D, the lengths of the first cycle T1 and the second cycle T2 may have substantially the same period. According to embodiments, the third section D3 and the length of the fourth section D4 may be different from each other. According to embodiments, the length of the third section D3 in which the non-sinusoidal DC bias signal is in an off state may be shorter than the length of the fourth section D4 in which the non-sinusoidal DC bias signal is in an on state. The length of the third section D3 may be shorter than the lengths of the first and second sections D1 and D2. The length of the fourth section D4 may be longer than the lengths of the first and second sections D1 and D2.

The fourth section D4 may overlap the first section D1 and the second section D2. For example, the RF signal may be turned off while the non-sinusoidal DC bias signal maintains an on state. Furthermore, the RF signal may not be turned off while the non-sinusoidal DC bias signal maintains the reference voltage Vref.

However, the disclosure is not limited thereto, and for example, depending on the phase of the RF signal, the second section D2 may overlap the third section D3, or the second section D2 may overlap each of the third and fourth sections D3 and D4. When the second section D2 overlaps each of the third and fourth sections D3 and D4, the second section D2 may overlap a transition time point from the third section D3 to the fourth section D4, or a transition time point from the fourth section D4 to the third section D3.

FIGS. 9A to 9D are schematic graphs for explaining the operation of an apparatus for processing plasma, according to an embodiment. For convenience of explanation, differences from FIGS. 1A to 8D are mainly described while redundant descriptions therebetween are omitted.

Referring to FIGS. 9A to 9D, the non-sinusoidal DC bias signal may always maintain the on-duty state regardless of the operation of the RF signal. For example, while the third section D3 does not exist, only the fourth section D4 may exist. For example, in a section in which the RF signal repeats turning on and turning off, the non-sinusoidal DC bias signal may maintain the on-duty state.

Figure 10:
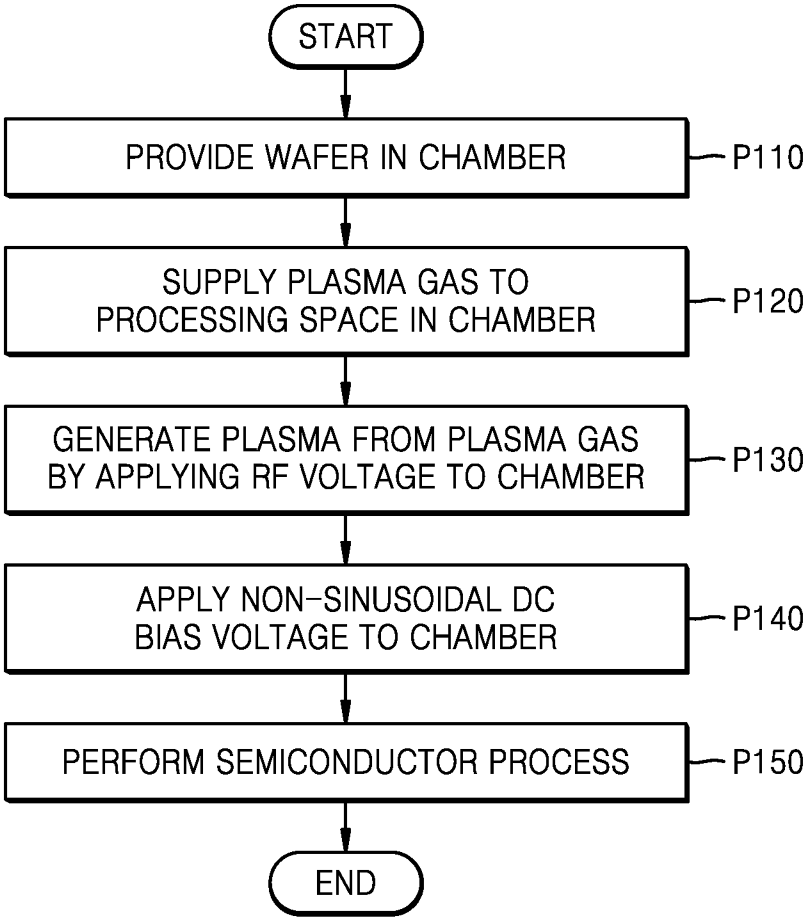
FIG. 10 is a flowchart of a method of processing plasma, according to an embodiment.
Figure 11:
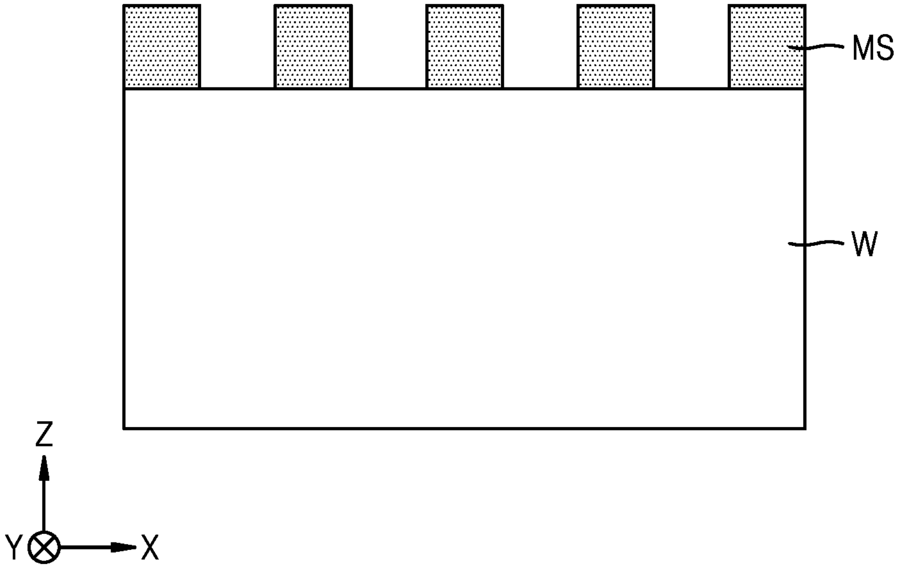
FIGS. 11 and 12 are cross-sectional views showing each operation of a method of processing plasma, according to an embodiment.
Figure 12:
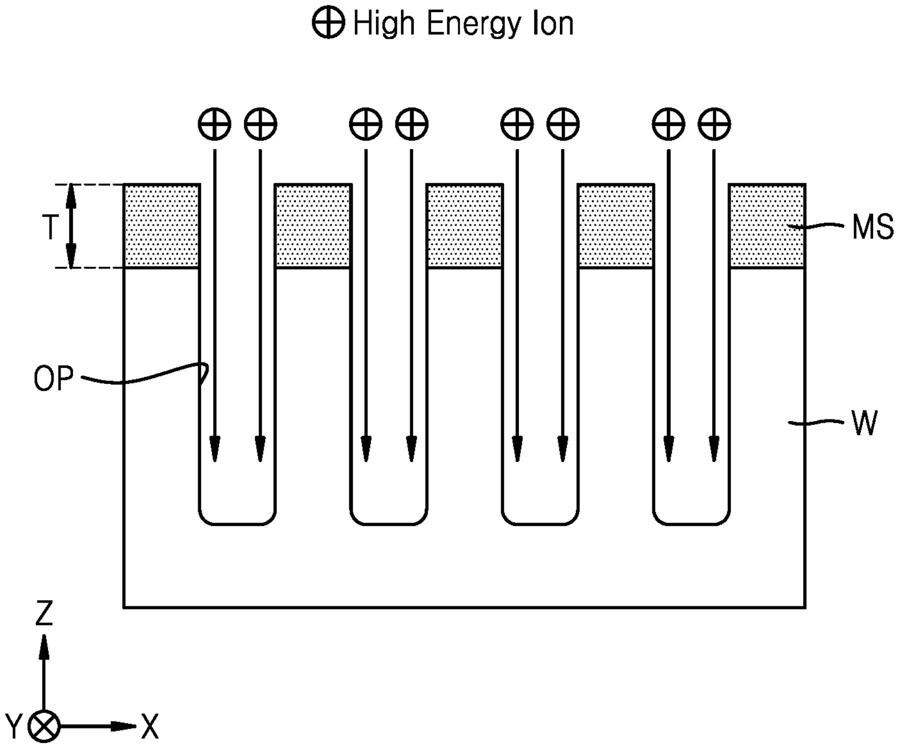

FIG. 10 is a flowchart of a method of processing plasma, according to an embodiment. FIGS. 11 and 12 are cross-sectional views showing each operation of a method of processing plasma, according to an embodiment. FIGS. 10, 11, and 12 are described with reference to FIGS. 1A to 9D.

Referring to FIGS. 1A, 10, and FIG. 11, first, the wafer W may be provided inside the chamber CB (P110). For example, the wafer W may be provided on an electrostatic chuck (not shown) in the chamber CB. For example, a mask MS may be formed on the wafer W. In an embodiment, the mask MS is formed on the wafer W prior to operation P110, and then, the wafer W with the mask MS may be provided to the inside of the chamber CB, or after the wafer W is provided to the inside of the chamber CB, the mask MS may be formed on the wafer W.

Next, referring to FIGS. 1A, 3, and 10, a plasma gas may be supplied to a processing space in the chamber CB (P120). The plasma gas may be supplied to the processing space by a gas supply device (not shown). Next, the first power generator 100 may applied an RF voltage to the chamber CB (P130). The first power generator 100 may apply the RF voltage to the top electrode TE and/or the bottom electrode BE. As the RF voltage is applied to the chamber CB, plasma may be generated from the plasma gas in the processing space.

Next, referring to FIGS. 1A, 10, 11, and 12, the second power generator 200 may generate a non-sinusoidal DC bias voltage having a non-sinusoidal DC bias signal illustrated in FIGS. 5A to 9D, and apply the non-sinusoidal DC bias voltage to the chamber CB (P140). Though the step P130 of generating the plasma is shown in FIG. 10 as occurring prior to the step P140 of applying the non-sinusoidal DC bias voltage, the two steps need not be performed in that order, and in some embodiments, the two processes may begin the same time, or either process may begin prior to the other. Next, a semiconductor process may be performed on the wafer W by the non-sinusoidal DC bias voltage (P150). For example, the semiconductor process may include a process of depositing the mask MS (e.g., the process of etching a mask layer to form a hard mask pattern, or mask MS). The mask MS may have a thickness T in a vertical direction (Z direction) on the wafer W. For example, the semiconductor process may include a process of forming a pattern, such as a plurality of openings OP by applying the non-sinusoidal DC bias voltage to the bottom electrode BE so that plasma ions generated in the processing space are incident onto the wafer W and an etching process is performed by the plasma ions. In an embodiment, after the operation P140, a process of monitoring the waveform of the non-sinusoidal DC bias voltage may be further included. The waveform of the non-sinusoidal DC bias voltage may be adjusted to fit to the process condition through the monitoring operation.

In the specification, the vertical direction (Z direction) may mean a direction perpendicular to a main surface of the wafer W.

FIG. 13 is a flowchart of a method of applying a non-sinusoidal DC bias voltage to a plasma chamber, according to an embodiment.

Referring to FIGS. 2A, 2B, 3, 10, and 13, an operation (P140*a*) (e.g., an example of operation P140 in FIG. 10) of applying a non-sinusoidal DC bias voltage to a plasma chamber by using the second power generator 200*a* of FIG. 2A or the second power generator 200*b* of FIG. 3 may first include an operation (P141) in which the pulse module 230-1 generates a square wave to provide a voltage level determined based on the target size of ion energy. For example, the operation P141 may be performed in a plurality of pulse modules 230-1 or 230-1*a*, and each of the pulse modules 230-1 or 230-1*a* may include an independent power and switch device. In detail, according to the target size of ion energy, a square wave may be generated by activating at least one of the pulse modules 230-1 or 230-1*a*. The voltage level of the square wave may be determined based on the number of the activated pulse modules 230-1.

Next, the slope module 230-2 may generate a variable waveform determined based on the target distribution of ion energy (P143). In detail, by controlling a transition section of a switch element in the slope module 230-2 by a current control method, a variable waveform having a variable voltage level may be generated in an on section of the switch element.

Next, the second power generators 200*a* and 200*b* may provide an output voltage having a set waveform by combining the square wave and the variable waveform (P145). According to the present embodiment, by connecting the pulse modules 230-1 and 230-1*a* with the slope module 230-2 by a cascade method, the square wave generated in the pulse modules 230-1 and 230-1*a* and the variable waveform generated in the slope module 230-2 may be combined with each other.

Figure 14:
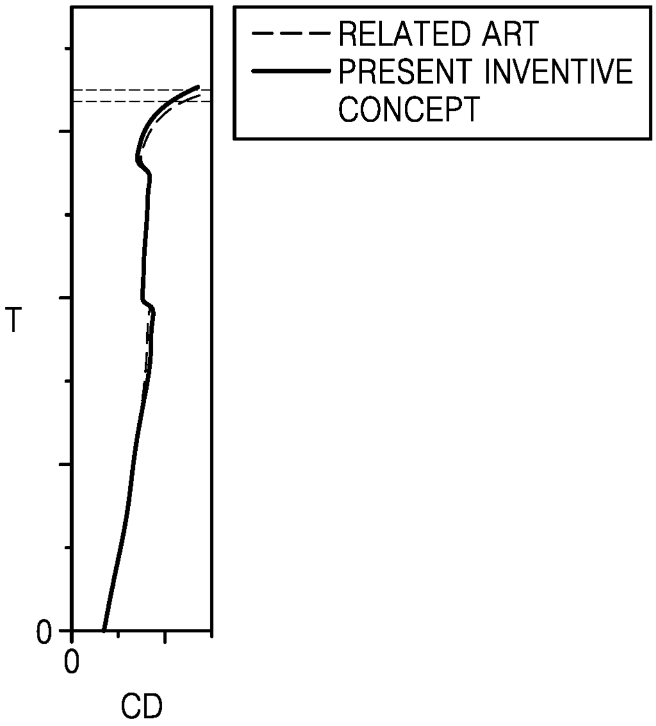
FIG. 14 is a graph showing the effect of an apparatus and method for processing plasma, according to an embodiment.

FIG. 14 is a graph showing the effect of an apparatus and method for processing plasma, according to an embodiment. For convenience of explanation, redundant descriptions between FIG. 14 and FIGS. 1A to 13 are omitted. In the graph, the vertical axis indicates the thickness T of the mask MS, and the horizontal axis indicates the critical dimension (CD) of a pattern.

Referring to FIGS. 12 and 14, according to a general plasma processing method according to the related art, the RF signal and the DC bias signal are synchronous with each other, and thus, when the RF signal is on duty, the DC bias signal is in an on-duty state, and when the RF signal is off duty, the DC bias signal is in an off-duty state. Accordingly, when the RF signal is off duty and the DC bias signal is in an on-duty state, a deposition process is insufficiently performed so that the thickness of a mask formed on a wafer is relatively thin. Accordingly, the reliability of a mask is relatively low, and etching selectivity is also relatively low.

In contrast, according to the plasma processing method according to aspects of the inventive concept, the RF signal and the non-sinusoidal DC bias signal are offset from each other, which in this specification means that they either turn to an on-state at different time points, turn to an off-state at different time points, or both turn to an on-state at different time points and turn to an off-state at different time points. Based on this arrangement, a case in which the non-sinusoidal DC bias signal is on duty and the RF signal is in an off-duty state exists. Accordingly, the deposition process of the mask MS may be sufficiently performed so that the thickness T of the mask MS formed on the wafer W is relatively thick. Accordingly, the reliability of the mask MS may be relatively high, and etching selectivity may also be relatively high.

Figure 15:
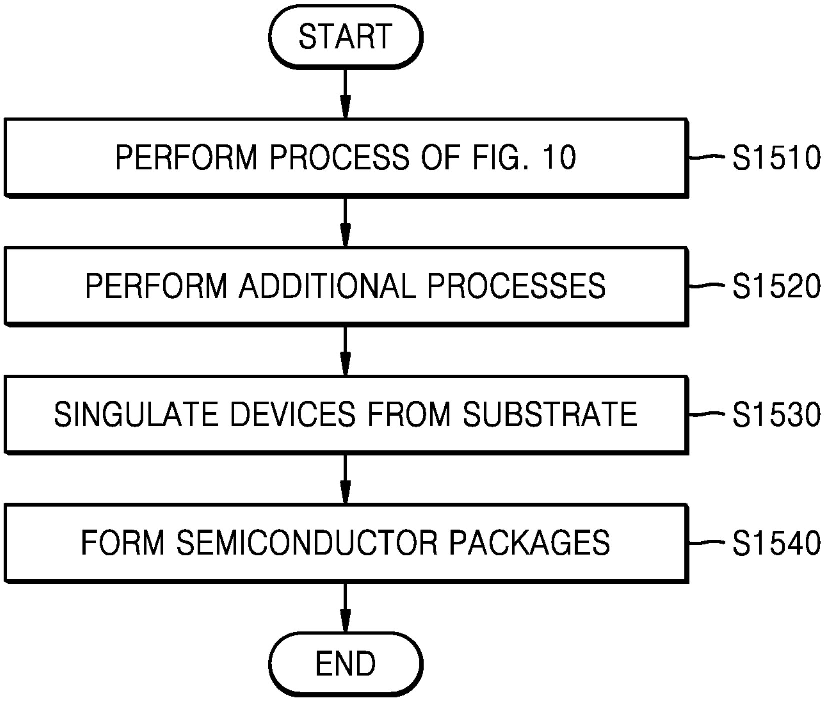
FIG. 15 is a flow chart showing an example method of manufacturing a semiconductor device, according to one embodiment.

FIG. 15 is a flow chart for explaining a method of manufacturing a semiconductor device according to example embodiments. A semiconductor device may be, for example, a semiconductor chip including an integrated circuit formed on a die, which may be a memory chip, logic chip, or a processor chip. The semiconductor device may also be a semiconductor package including a package substrate, one or more semiconductor chips formed on the package, and an encapsulant covering the package substrate and the one or more semiconductor chips As one example, in step S1510, a process such as described in connection with FIGS. 10-13 is performed. For example, a mask having a mask pattern may be formed using one of the embodiments described herein, and a layer on a substrate or wafer may be etched using the mask. In step S1520, a plurality of additional processes, such a plating or deposition process, a planarization process, a cleaning process and various other processes for manufacturing a semiconductor device, are performed. These may be carried out in different chambers. The result of these processes may include a plurality integrated circuits on the wafer. For example, each integrated circuit may be a memory device or a logic device. In step S1530, the devices may be singulated from the substrate to form individual semiconductor devices (e.g., chips). In step S1540, the semiconductor devices may be packaged, for example, into a semiconductor package, for example, by placing each chip on a package substrate and forming an encapsulation layer to cover the chip and the package substrate.

While the inventive concept has been particularly shown and described with reference to embodiments thereof, it will be understood that various changes in form and details may be made therein without departing from the spirit and scope of the following claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A method of manufacturing a semiconductor device, comprising:

placing a wafer in a plasma chamber, the chamber including:

a first power generator configured to generate plasma ions in the chamber, and a second power generator configured to accelerate the plasma ions toward the wafer;

generating a radio frequency (RF) signal having a repeated periodic sinusoidal waveform in an on state and a steady off state by the first power generator, and generating a direct current (DC) bias signal having a repeated periodic non-sinusoidal waveform in an on state and a steady off state by the second power generator, wherein the RF signal and the DC bias signal are offset from each other; and performing a plasma process on a layer on the wafer, using the RF signal and DC bias signal, wherein the RF signal is turned on after the DC bias signal is turned on and while the DC bias signal remains in an on duty.

2. The method of claim 1, wherein time points when the RF signal and the DC bias signal are respectively turned on are different from each other, and time points when the RF signal and the DC bias signal are respectively turned off are different from each other.

3. The method of claim 1, wherein time points when the RF signal is turned on and the DC bias signal is turned off are different from each other, and/or time points when the RF signal is turned off and the DC bias signal is turned on are different from each other.

4. The method of claim 1, wherein the RF signal is is turned off while the DC bias signal is in an off duty.

5. The method of claim 1, wherein the second power generator is configured to generate a voltage less than or equal to a reference voltage.

6. The method of claim 1, wherein the second power generator is configured to alternately generate, during an on duty, a voltage greater than a reference voltage and a voltage less than the reference voltage.

7. The method of claim 1, wherein the RF signal consecutively turns on and turns off while the DC bias signal is in an on duty.

8. A method of manufacturing a semiconductor device using a chamber in which a plasma process is performed, the method comprising:

placing a wafer on a bottom electrode located inside the chamber;

generating a first reference voltage in a first time section and first power in a second time section and applying the first reference voltage and first power to the bottom electrode; and generating a second reference voltage in a third time section and second power in a fourth time section and applying the second reference voltage and the second power to the bottom electrode, wherein:

the first and second time sections arrive alternately and repeatedly, and form a first steady signal alternating with an RF signal;

the third and fourth time sections arrive alternately and repeatedly, overlap the first and second time sections, and form a second steady signal alternating with a periodic signal;

the second power is generated as a signal having a non-sinusoidal waveform, and the second reference voltage in the third time section and second power in the fourth time section form a direct current (DC) bias signal, and the first reference voltage in the first time section and first power in the second time section form a radio frequency (RF) signal, and the RF signal and the DC bias signal are offset from each other.

9. The method of claim 8, wherein the second time section overlaps the third time section.

10. The method of claim 8, wherein a length of each of the first and second time sections is different from a length of the third time section.

11. The method of claim 8, wherein lengths of the first to fourth time sections are the same.

12. The method of claim 8, wherein the second power is generated by a power generator that comprises at least one pulse module configured to generate a square wave and at least one slope module configured to generate a variable waveform, and the DC bias signal has a set waveform corresponding to a sum of the square wave and the variable waveform.

13. The method of claim 8, wherein the second time section overlaps 1% to 99% of the fourth time section.

14. The method of claim 8, further comprising a filter connected between the bottom electrode and an output terminal of a second power generator that generates the second power, and configured to block the first power, which is generated by a first power generator connected to the bottom electrode, and to allow the second power to pass through the filter, wherein the filter comprises at least one of a low pass filter, a high pass filter, a band pass filter, and a band stop filter.

15. The method of claim 8, wherein the DC bias signal has a frequency selected from a range from 1 kHz to 1 MHz.

16. A method of manufacturing a semiconductor device, the method comprising:

placing a wafer in a chamber;

generating first power to generate plasma in the chamber;

generating second power to control ion energy of the plasma; and applying the first and second powers to the chamber to perform a plasma process on the wafer, wherein:

the first power comprises a radio frequency (RF) signal, the second power includes a direct current (DC) bias signal, the second power has a non-sinusoidal waveform, and the RF signal and the DC bias signal are applied at the same time in the chamber and are offset from each other, and wherein the generating of the second power comprises:

generating a square wave to provide a voltage level determined based on a target size of the ion energy, generating a variable waveform determined based on a target distribution of the ion energy, and providing the second power having a set waveform by combining the square wave and the variable waveform.

17. The method of claim 16, wherein, in a time section in which the first power is in an on duty, the second power repeats turning on and turning off.

18. The method of claim 16, wherein the first power is applied to a bottom electrode or a top electrode of the chamber, and the second power is applied to the top-bottom electrode of the chamber.

* * * * *